(12) United States Patent
Lampert et al.

(10) Patent No.: US 10,565,515 B2
(45) Date of Patent: Feb. 18, 2020

(54) QUANTUM CIRCUIT ASSEMBLIES WITH TRIAXIAL CABLES

(71) Applicant: Intel Corporation, Santa Clara, CA (US)

(72) Inventors: Lester Lampert, Portland, OR (US); Ravi Pillarisetty, Portland, OR (US); Nicole K. Thomas, Portland, OR (US); Hubert C. George, Portland, OR (US); Jeanette M. Roberts, North Plains, OR (US); David J. Michalak, Portland, OR (US); Roman Caudillo, Portland, OR (US); Zachary R. Yoscovits, Beaverton, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/013,384

(22) Filed: Jun. 20, 2018

(65) Prior Publication Data

US 2019/0042968 A1 Feb. 7, 2019

(51) Int. Cl.

| | |
|---|---|
| *G06N 10/00* | (2019.01) |
| *B82Y 10/00* | (2011.01) |
| *H01L 39/22* | (2006.01) |
| *H03K 19/195* | (2006.01) |
| *H01L 27/18* | (2006.01) |
| *H01R 24/56* | (2011.01) |

(52) U.S. Cl.
CPC .............. *G06N 10/00* (2019.01); *B82Y 10/00* (2013.01); *H01L 27/18* (2013.01); *H01L 39/223* (2013.01); *H03K 19/195* (2013.01); *H01R 24/562* (2013.01)

(58) Field of Classification Search
None
See application file for complete search history.

(56) References Cited

U.S. PATENT DOCUMENTS

| | | | | |
|---|---|---|---|---|
| 4,799,902 A | * | 1/1989 | Laudig | H01R 24/562 |
| | | | | 439/580 |
| 5,730,623 A | * | 3/1998 | Krantz | H01R 24/44 |
| | | | | 439/580 |

(Continued)

OTHER PUBLICATIONS

Béjanin, J. H., et al. "Three-Dimensional Wiring for Extensible Quantum Computing: The Quantum Socket." Physical Review Applied, vol. 6, No. 4, 2016, doi:10.1103/physrevapplied.6.044010 (Year: 2016).*

(Continued)

*Primary Examiner* — J. E. Schoenholtz
(74) *Attorney, Agent, or Firm* — Patent Capital Group

(57) ABSTRACT

Embodiments of the present disclosure describe quantum circuit assemblies utilizing triaxial cables to communicate signals to/from quantum circuit components. One assembly includes a cooling apparatus for cooling a quantum circuit component that includes at least one qubit device. The cooling apparatus includes at least one triaxial connector for providing signals to and/or receiving signals from the quantum circuit component using one or more triaxial cables. Other assemblies include quantum circuit components and various electronic components (e.g. attenuators, filters, or amplifiers) for use within the cooling apparatus, adapted to be used with triaxial cables by incorporating triaxial connectors as well.

25 Claims, 15 Drawing Sheets

(56) References Cited

U.S. PATENT DOCUMENTS

| | | | |
|---|---|---|---|
| 9,312,639 B2* | 4/2016 | Vinther | H01R 13/6473 |
| 2004/0169572 A1* | 9/2004 | Elmore | H01P 3/10 |
| | | | 333/240 |
| 2012/0156902 A1* | 6/2012 | Paine | H01R 12/727 |
| | | | 439/78 |
| 2013/0264617 A1 | 10/2013 | Joshi et al. | |
| 2014/0266496 A1* | 9/2014 | Abraham | H01R 43/00 |
| | | | 333/33 |
| 2019/0027800 A1* | 1/2019 | El Bouayadi | H01P 3/08 |
| 2019/0130298 A1* | 5/2019 | Pioro-Ladriere | H01L 29/122 |

OTHER PUBLICATIONS

Tuckerman, David B, et al. "Flexible Superconducting Nb Transmission Lines on Thin Film Polyimide for Quantum Computing Applications." Superconductor Science and Technology, vol. 29, No. 8, 2016, p. 084007., doi:10.1088/0953-2048/29/8/084007 (Year: 2016).*

S. Krinner, S. Storz, P. Kurpiers, P. Magnard, J. Heinsoo, R. Keller, J. Luetolf, C. Eichler, and A. Wallraff, "Engineering cryogenic setups for 100-qubit scale superconducting circuit systems," e-print arXiv:1806.07862. Jun. 20, 2016. (Year: 2016).*

"A Nanodamascene Process for Advanced Single-Electron Transistor Fabrication," Dubuc et al, IEEE Transactions on Nanotechnology, vol. 7, No. 1, Jan. 2008, pp. 68-73.

"A two-qubit logic gate in silicon," Veldhorst et al., Nature, vol. 526, Oct. 15, 2015, pp. 410-414.

"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

"Independent, extensible control of same-frequency superconducting qubits by selective broadcasting," Asaad et al., Netherlands Organisation for Applied Scientific Research, Aug. 28, 2015, 17 pages.

"Fast sensing of double-dot charge arrangement and spin state with an rf sensor quantum dot," Barthel et al, Materials Department, University of California, Santa Barbara, Jan. 16, 2014, 4 pages.

"Undoped accumulation-mode Si/SiGe quantum dots," Borselli et al, HRL Laboratories, LLC., Jul. 15, 2014, 4 pages.

"Multilayer microwave integrated quantum circuits for scalable quantum computing," Brecht et al, Department of Applied Physics, Yale University, Sep. 4, 2015, 5 pages.

"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.

"Spin Relaxation and Decoherence of Holes in Quantum Dots," Bulaev et al., Phys. Rev. Lett. 95, 076805, Aug. 11, 2005, 1 page.

"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.

"Ultrafast optical control of individual quantum dot spin qubits," De Greve et al, Reports on Progress in Physics, vol. 76, No. 9, Sep. 4, 2013, 2 pages.

"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.

"How it's built: Micron/Intel3D NAND Micron Opens the Veil a Little," Moyer, Bryon, retrieved from https://www.eejournal.com/article/20160201-micron/ on Nov. 29, 2017, 9 pages.

"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.

"Platinum single-electron transistors with tunnel barriers made by atomic layer deposition", George et al., Department of Electrical Engineering, University of Notre Dame, Published Nov. 5, 2010, 3 pages.

"Surface loss simulations of superconducting coplanar waveguide resonators," Wenner et al, Applied Physics Letters 99, 113513 (2011), pp. 113513-1 through 3.

"Quantum computation with quantum dots," Loss et al , Physical Review A, vol. 57, No. 1, Jan. 1998, pp. 120-126.

"Ultafast high-fidelity initialization of a quantum-dot spin qubit without magnetic fields," Mar et al., Phys. Rev. B 90 241303®, published Dec. 15, 2014, 1 page.

"Delaying Forever: Uniaxial Strained Silicon Transistors in a 90nm CMOS Technology," Mistry et al Portland Technology Department, TCAD, Intel Corp., 2 pages.

Supplementary Information, retrieved from www.nature.com, doi:10.1038/nature 15263, 8 pages.

"Magnetic field tuning of coplanar waveguide resonators," Healey, et al., Applied Physics Letters 93, 043513 (2008), pp. 043513-1 through 3 (4 pages with cover sheet).

"Embracing the quantum limit in silicon computing," Morton et al, Macmillan Publishers, Nov. 17, 2011, vol. 479, Nature, pp. 345-353.

"Review : Towards Spintronic Quantum Technologies with Dopants in Silicon," Morley, Gavin, Department of Physics, University of Warwich, 13 pages.

"A Reconfigurable Gate Architecture for Si/SiGe Quantum Dots," Zajac et al., Department of Physics, Princeton University; Department of Physics, University of California; Feb. 6, 2015, 5 pages.

"Scalable quantum circuit and control for a superconducting surface code," Versluis et al, Netherlands Organisation for Applied Scientific Research, Dec. 28, 2016, 9 pages.

"Defect reduction of selective Ge epitaxy in trenches on Si(001) substrates using aspect ratio trapping," Park et al., Applied Physics Letter 90, 052113 (2007), pp. 052113-1 through 3.

"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).

"Radio frequency measurements of tunnel couplings and singlet-triplet spin states in Si:P quantum dots," House et al., Nature Communications, 6:884, DOI: 10.1038/ncomms9848, pp. 1-6.

"Detecting big-flip errors in a logical qubit using stabilizer measurements," Riste et al., Nature Communications, 6:6983, DOI: 10.1038/ncomms7983, pp. 1-6.

"Scalable gate architecture for densely packed semiconductor spin qubits," Zajac et al, Department of Physics, Princeton University; Sandia National Laboratories, 8 pages.

"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, Mesa + Institute for Nanotechnology, University of Twente, The Netherlands, Oct. 2, 2016, 13 pages.

"Single-electron Transistors fabricated with sidewall spacer patterning," Park et al., Superlattices and Microstructures 34 (2003) 231-239.

"Single-electron Transistors with wide operating temperature range," Dubuc et al., Applied Physics Letters 90, 113104 (2007) pp. 113104-1 through 3.

"Single-shot read-out of an individual electron spin in a quantum dot," Elzerman et al., Nature, vol. 430, Jul. 22, 2004, pp. 431-435.

"Suspending superconducting qubits by silicon micromachining," Chu et al., Department of Applied Physics, Yale University, Jun. 10, 2016, 10 pages.

"Single-charge tunneling in ambipolar silicon quantum dots," Müller, Filipp, Dissertation, University of Twente, Jun. 19, 2015, 148 pages.

(56) References Cited

OTHER PUBLICATIONS

"An addressable quantum dot qubit with fault-tolerant control-fidelity," Veldhorst et al., Nature Nanotechnology vol. 9, Dec. 2014, pp. 981-985.
"A two-quibit logic gate in silicon," Veldhorst et al., Nature, vol. 526, Dec. 15, 2015, pp. 410-414.

* cited by examiner

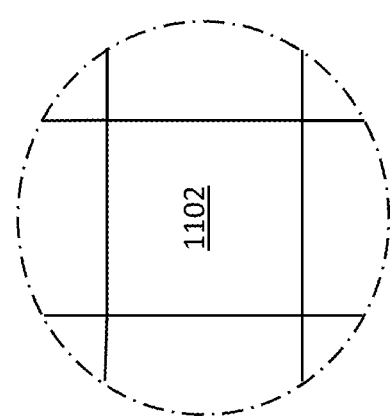
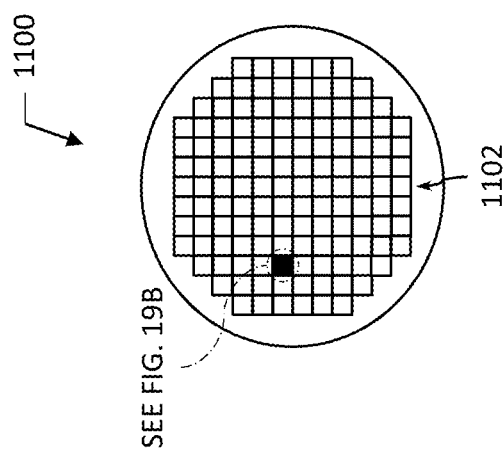
FIG. 19B
FIG. 19A

QUANTUM CIRCUIT ASSEMBLIES WITH TRIAXIAL CABLES

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being below 100. One of the main challenges resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence. Providing signals to quantum circuit components with such qubits is not a trivial task and further improvements would be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 19A and 19B are top views of a wafer and dies that may include one or more of qubit devices disclosed herein.

DETAILED DESCRIPTION

Overview

Figure 1:
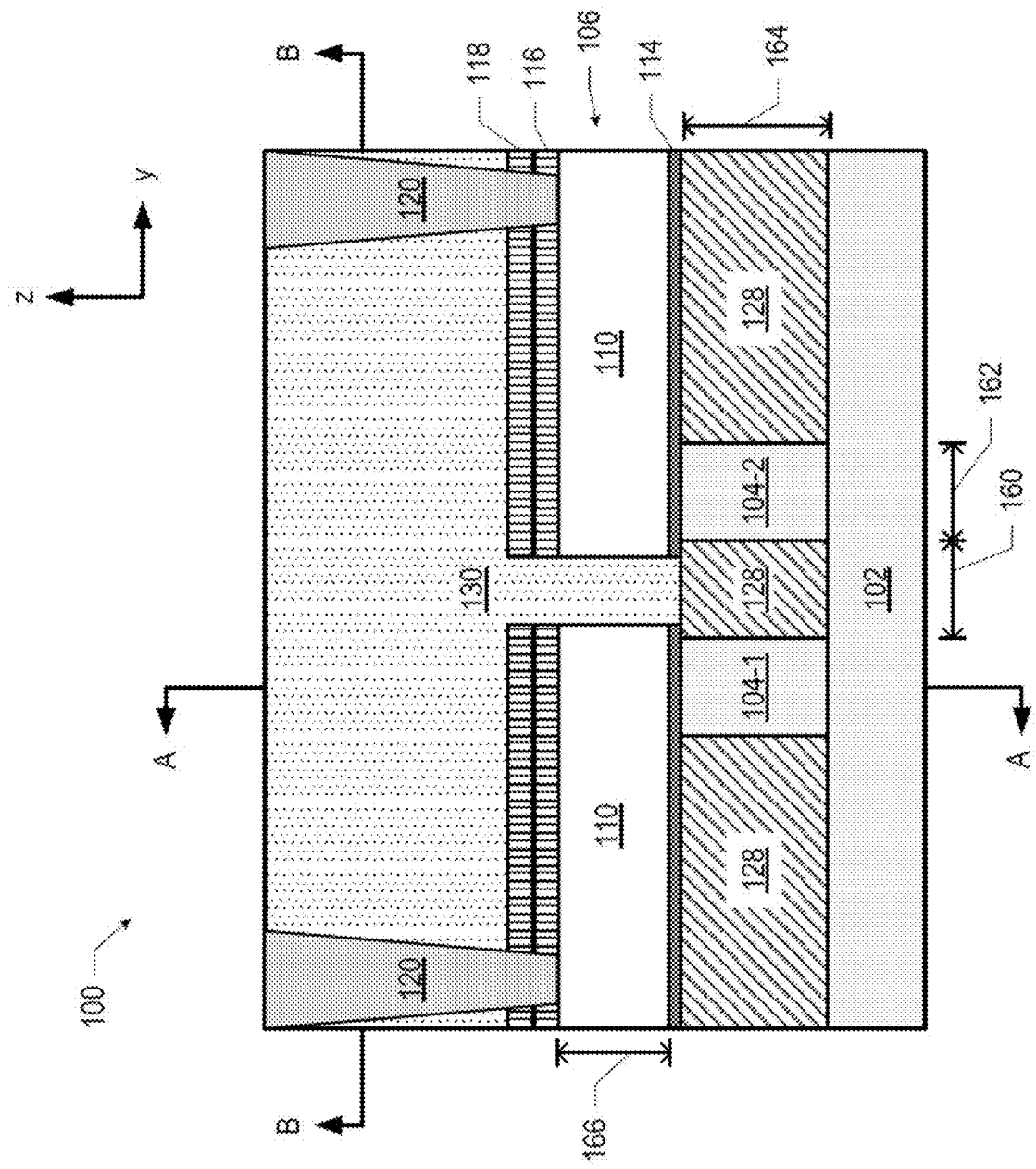
FIGS. 1-3 are cross-sectional views of an example device implementing quantum dot qubits, according to some embodiments of the present disclosure.

As briefly described above, quantum computing, or quantum information processing, refers to the field of research related to computation systems that use quantum-mechanical phenomena to store and manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. So for example, two entangled qubits are now represented by a superposition of 4 quantum states, and N entangled qubits are represented by a superposition of $2^N$ quantum states. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e. by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e. computers that use phenomena of classical physics). Furthermore, as briefly described above, for the reason of protecting fragile qubits from decoherence, they are often operated at cryogenic temperatures by being placed in a suitable cooling apparatus, e.g. a dilution refrigerator. This raises challenges from accurate estimation and control of the temperatures to providing various signals to qubit devices which must be kept at such low temperatures.

None of the challenges described above ever had to be addressed for classical computers, and these challenges are not easy. In particular, while current cabling methods for providing signals to qubits kept at cryogenic temperatures during operation may be suitable for high frequencies and high-density of direct current (DC) lines, no cabling solutions exist for providing or measuring very low currents while reducing settling time and providing sufficient robustness to noise. In addition, continuously cooling the qubits to keep them at cryogenic temperatures during operation is a difficult task to begin with, further complicated by the fact that cooling efforts are hindered by various sources of temperature increase due to the overall configuration of an assembly in which qubits are operating. For example, one such source is that, while the qubits themselves are kept in a helium mixing chamber of a dilution refrigerator in order to be kept at millikelvin temperatures during their operation, electrical connections providing charge carriers to qubits are mainly outside of this mixing chamber. As a result, charge carriers provided to qubits may be at much higher temperatures, raising temperatures of the qubits. Improved devices and methods for providing signals to quantum circuit components implementing various types of qubits are, therefore, imperative to for ensuring proper operation of the qubits.

Embodiments of the present disclosure describe quantum circuit assemblies utilizing triaxial cables to communicate signals to/from quantum circuit components implementing qubit devices. One quantum circuit assembly includes a cooling apparatus, e.g. a dilution refrigerator, for cooling a quantum circuit component that includes at least one qubit device (herein, the terms "qubit device" and "qubit" may be used interchangeably). The cooling apparatus includes at least one triaxial connector for providing signals to and/or receiving signals from the quantum circuit component (when the quantum circuit component is in a cooling chamber of the cooling apparatus) using one or more triaxial cables. Other quantum circuit assemblies include quantum circuit components and various electronic components (e.g. attenuators, filters, or amplifiers) for use within the cooling apparatus, adapted to be used with triaxial cables by incorporating triaxial connectors as well. Conversion mechanisms for converting coaxial cables used in a cooling apparatus for a quantum circuit component to triaxial cables are disclosed as well. Using triaxial cables within a cooling apparatus for quantum circuit components may reduce electromagnetic interference (EMI) and cross talk between neighboring signal wires, reduce settling time, and make operation of the quantum circuit components more robust to noise, compared to conventional implementations. As a result, communication of very small signals, often needed during operation of the quantum circuit components, between the quantum circuit components and various electronic components kept at cryogenic temperatures may be improved.

In various embodiments, quantum circuit component(s) integrated with one or more triaxial connectors as described herein may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

While some descriptions are provided with reference to quantum dot qubits and to superconducting qubits, in particular to transmons, a particular class of superconducting qubits, at least some teachings of the present disclosure may be applicable to implementations of quantum circuit components with any qubits, e.g. including superconducting qubits other than transmons and/or including qubits other than superconducting qubits and quantum dot qubits, which may be used within a cooling apparatus with one or more triaxial cables, all of which implementations are within the scope of the present disclosure. Furthermore, in some embodiments, the quantum circuit components described herein may implement hybrid semiconducting-superconducting quantum circuits.

In order to provide substantially lossless connectivity to, from, and between the qubits, some or all of the electrically conductive portions of quantum circuit assemblies described herein, in particular various conductors of triaxial cables described herein, as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g. materials which exhibit superconducting behavior at very low temperatures at which qubits typically operate), but which may or may not exhibit such behavior at higher temperatures (e.g. at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as e.g. not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−5-20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, such as e.g. "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious TLS's may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-30 GHz, e.g. in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Triaxial Cables Used with Various Types of Qubits

As described above, the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. semiconducting qubits including those made using quantum dots (e.g., spin qubits and charge qubits), superconducting qubits (e.g. flux qubits or transmon qubits, the latter sometimes simply referred to as "transmons"), photon polarization qubits, single trapped ion qubits, etc. To indicate that these devices implement qubits, sometimes these devices are referred to as qubits, e.g. quantum dot qubits, superconducting qubits, etc.

Figure 13:
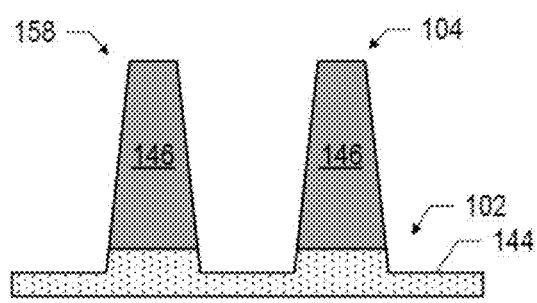
Figure 14:
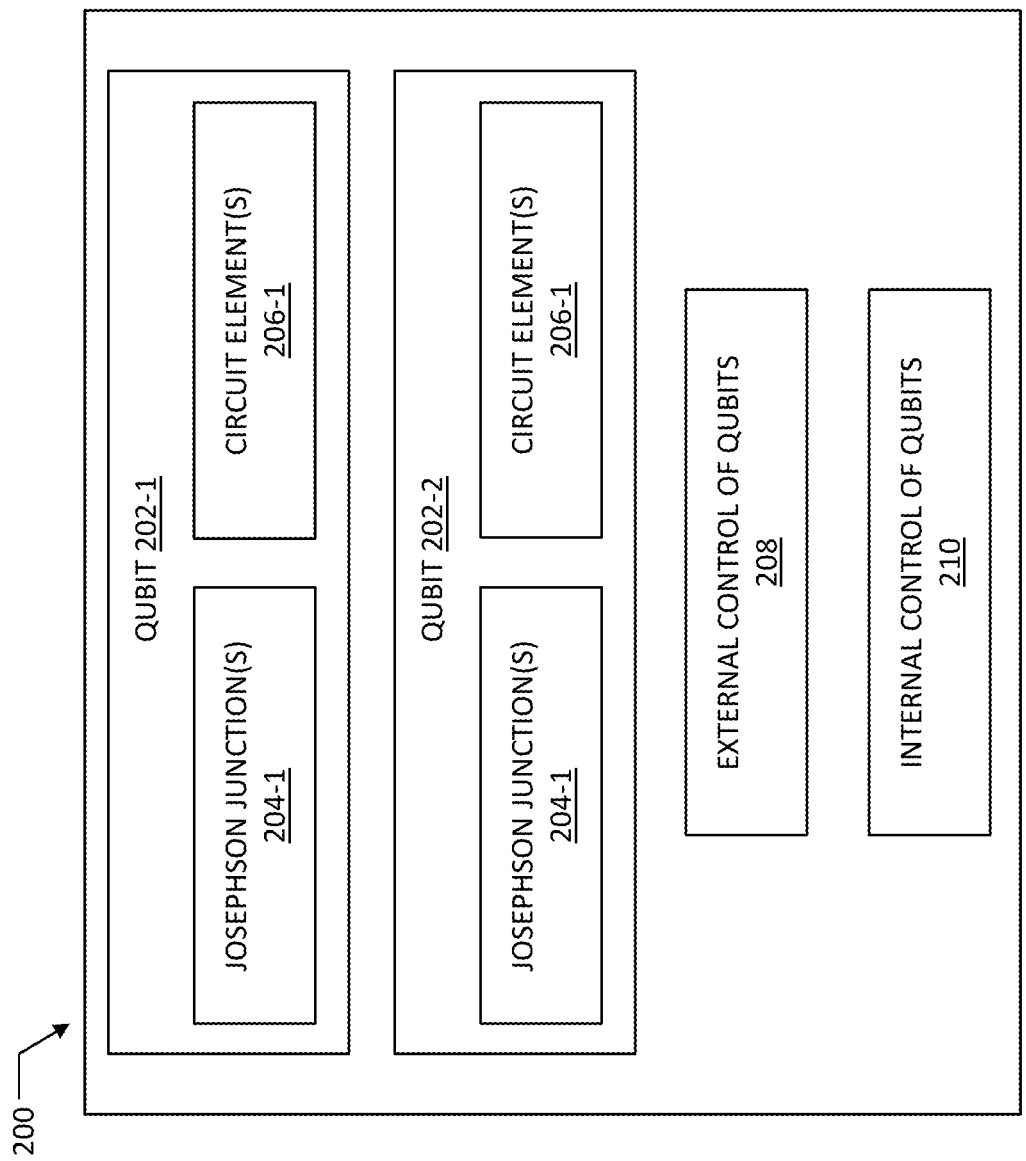
FIG. 14 provides a schematic illustration of an example device implementing superconducting qubits, according to some embodiments of the present disclosure.
Figure 15:
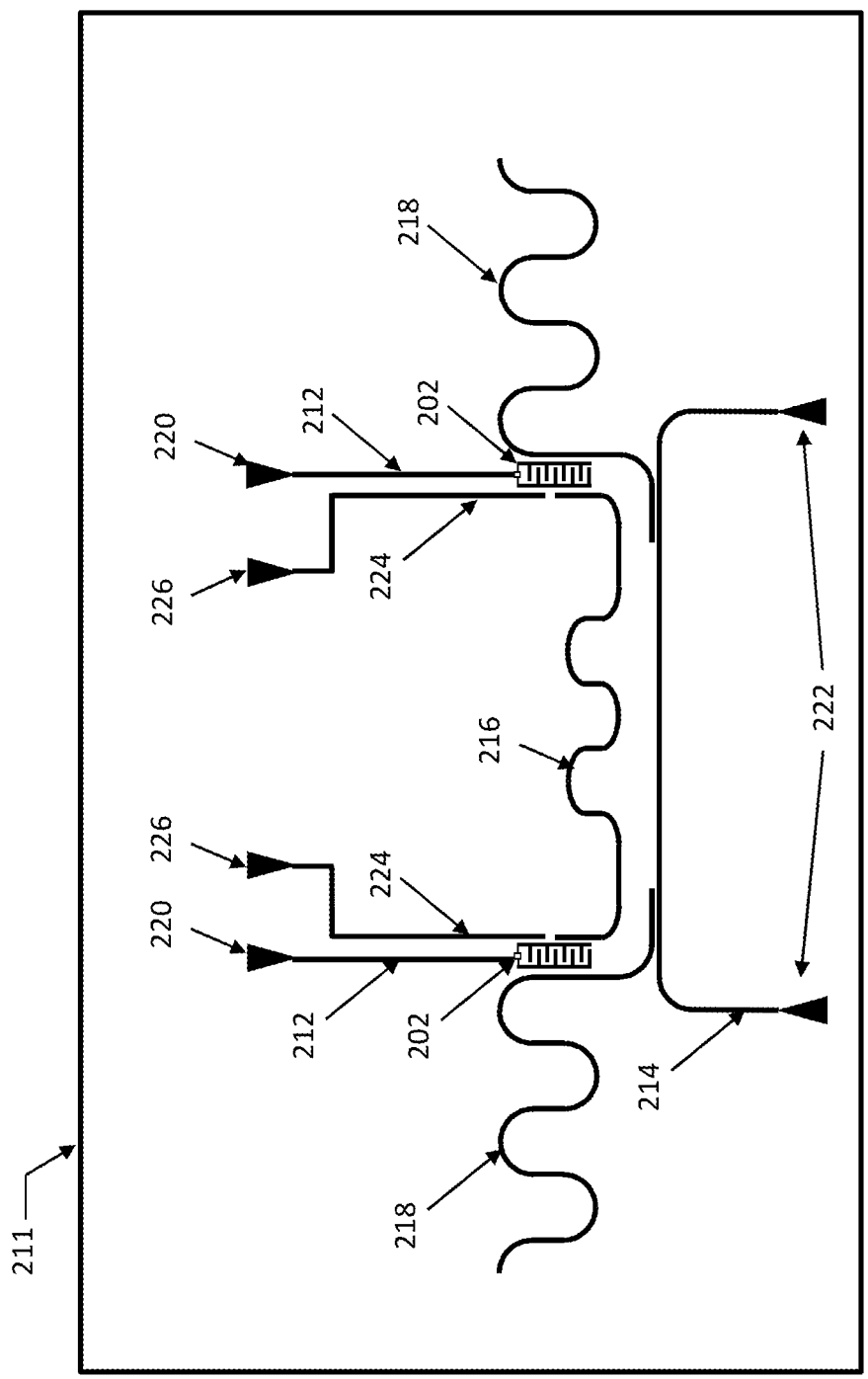
FIG. 15 provides a schematic illustration of an example physical layout of a device implementing superconducting qubits, according to some embodiments of the present disclosure.

The type of qubits used in a quantum circuit component would affect what types of signals are to be provided to or received from the quantum circuit component using one or more triaxial cables described herein. Below, two example quantum circuit components are described—one incorporating quantum dot qubits (FIGS. 1-13) and one incorporating superconducting qubits (FIGS. 14-15). However, integration of triaxial cables and triaxial connectors within a cooling apparatus as described herein is applicable to quantum circuit components that include any type of qubits, all of which are within the scope of the present disclosure.

Example Quantum Circuit Components with Quantum Dot Qubits

Quantum dot devices may enable the formation of quantum dots to serve as quantum bits (i.e. as qubits) in a quantum computing device. One type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this is the type of a qubit device that is described as a first example qubit device that may be used in a quantum circuit component to be operated and/or tested in a cooling apparatus with one or more triaxial cables as described herein, according to some embodiments of the present disclosure.

Figure 2:
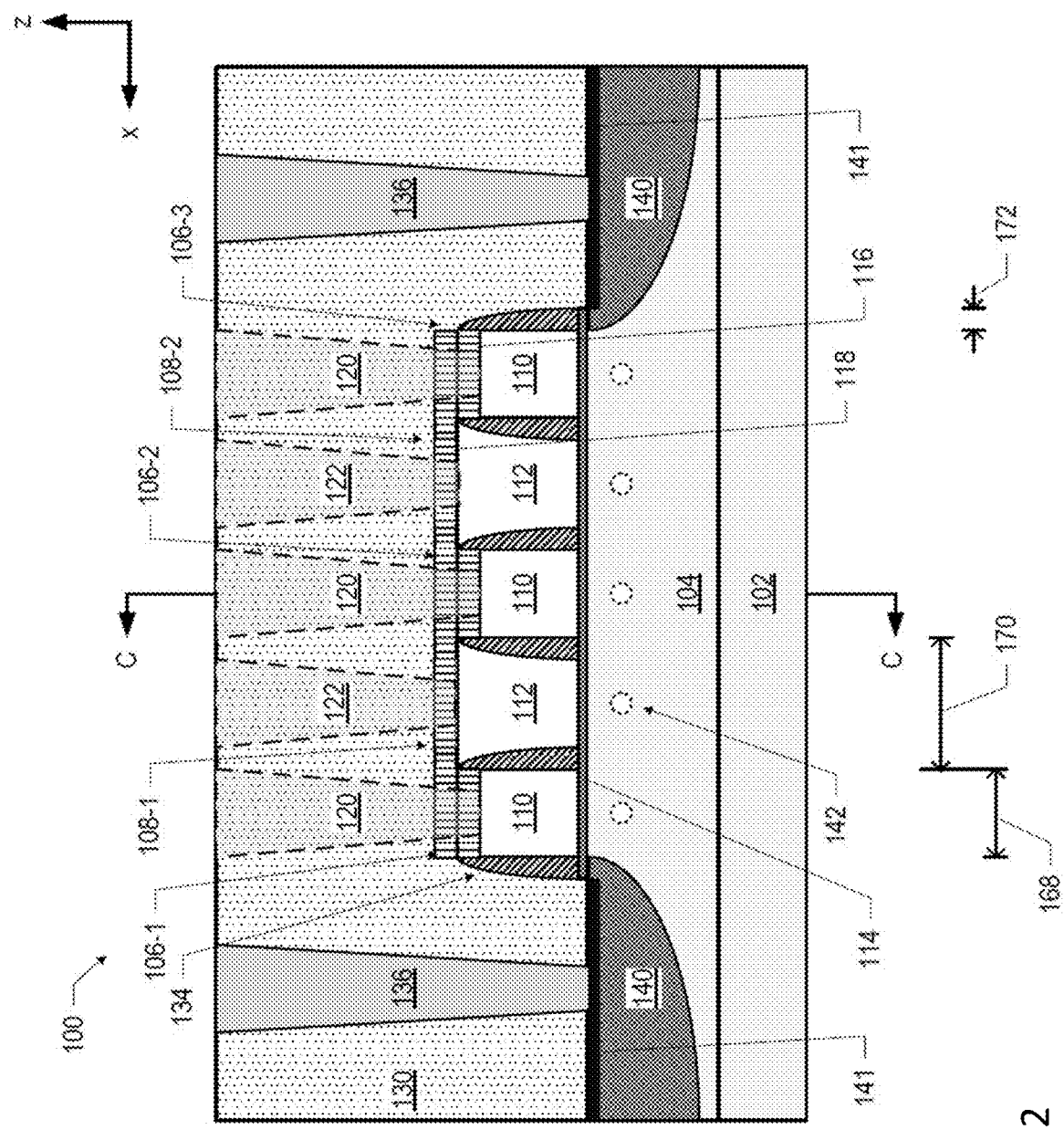
Figure 3:
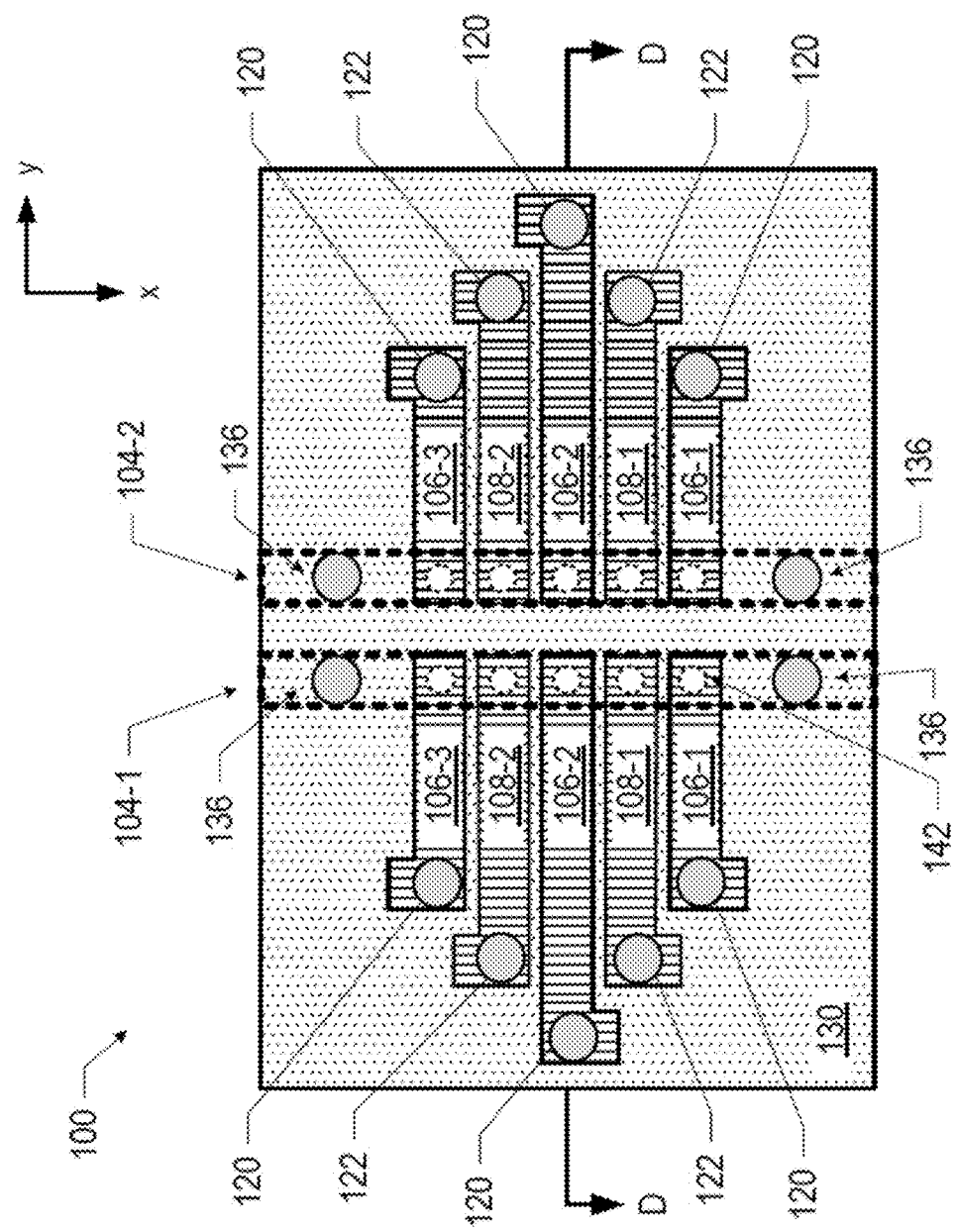

FIGS. 1-3 are cross-sectional views of an example quantum dot device 100 implementing quantum dot qubits, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 (while FIG. 1 illustrates a quantum dot device 100 taken along the section D-D of FIG. 3). Although FIG. 1 indicates that the cross-section illustrated in FIG. 2 is taken through the fin 104-1, an analogous cross-section taken through the fin 104-2 may be identical, and thus the discussion of FIGS. 1-3 refers generally to the "fin 104."

A quantum circuit component to be operated and/or tested in a cooling apparatus with one or more triaxial cables as described herein may include one or more of the quantum dot devices 100.

As shown in FIGS. 1-3, the quantum dot device 100 may include a base 102 and multiple fins 104 extending away from the base 102. The base 102 and the fins 104 may include a semiconductor substrate and a quantum well stack (not shown in FIGS. 1-3, but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer of the quantum well stack (discussed below with reference to the quantum well layer 152 of FIGS. 4-6). Examples of base/fin arrangements are discussed below with reference to the base fin arrangements 158 of FIGS. 7-13.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include a quantum well layer (not shown in FIGS. 1-3, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 microns.

Multiple gates may be disposed on each of the fins 104. In the embodiment illustrated in FIG. 2, three gates 106 and two gates 108 are shown as distributed on the top of the fin 104. This particular number of gates is simply illustrative, and any suitable number of gates may be used. Additionally, multiple groups of gates like the gates illustrated in FIG. 2 may be disposed on the fin 104.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114. In the embodiment illustrated in FIG. 2, the gate dielectric 114 for all of the gates 106/108 is provided by a common layer of gate dielectric material. In other embodiments, the gate dielectric 114 for each of the gates 106/108 may be provided by separate portions of gate dielectric 114. In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 2 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 2, and insulating spacers 134 may be disposed on the sides of the gate metal 110 and the hardmask 116. As illustrated in FIG. 2, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the fin 104. In the embodiment illustrated in FIG. 2, the hardmask 118 may extend over the hardmask 116 (and over the gate metal 110 of the gates 106), while in other embodiments, the hardmask 118 may not extend over the gate metal 110 (e.g., as discussed below with reference to FIG. 45). In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108 may extend between the proximate spacers 134 on the sides of the gate 106-1 and the gate 106-3, as shown in FIG. 2. In some embodiments, the gate metal 112 may extend between the spacers 134 on the sides of the gate 106-1 and the gate 106-3. Thus, the gate metal 112 may have a shape that is substantially complementary to the shape of the spacers 134, as shown. In some embodiments in which the gate dielectric 114 is not a layer shared commonly between the gates 108 and 106, but instead is separately deposited on the fin 104 between the spacers 134 (e.g., as discussed below with reference to FIGS. 40-44), the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIG. 2, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fins 104 and towards the other fin 104, but may be isolated from their counterpart gates by the intervening insulating material 130.

As shown in FIG. 2, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2 and 3 for ease of illustration, but five are indicated as dotted circles in each fin 104, forming what may be referred to as a "quantum dot array." The location of the quantum dots 142 in FIG. 2 is not intended to indicate a particular geometric positioning of the quantum dots 142. The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable material; for example, in embodiments in which the doped region 140 includes silicon, the interface material 141 may include nickel silicide.

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-3, the gates 106 may extend away from the fins 104, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may extend away from the fins 104, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, and 136 may be electrically isolated from each other by an insulating material 130. The insulating material 130 may be any suitable material, such as an interlayer dielectric (ILD). Examples of the insulating material 130 may include silicon oxide, silicon nitride, aluminum oxide, and/or silicon oxynitride. As known in the art of IC manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

Although not specifically shown in FIGS. 1-3, the quantum dot device 100 may further include one or more accumulation gates used to form a 2DEG in the quantum well area between the area with the quantum dots and the reservoir such as e.g. the doped regions 140 which, as previously described, may serve as a reservoir of charge carriers for the quantum dot device 100. Using such accumulation gates may allow to reduce the number of charge carriers in the area adjacent to the area in which quantum dots are to be formed, so that single charge carriers can be transferred from the reservoir into the quantum dot array. In various embodiments, an accumulation gate may be implemented on either side of an area where a quantum dot is to be formed.

Although also not specifically shown in FIGS. 1-3, some implementations of the quantum dot device 100 further include or are coupled to a magnetic field source used for spin manipulation of the charge carriers in the quantum dots. In various embodiments, e.g. a microwave transmission line or one or more magnets with pulsed gates may be used as a magnetic field source. Once a quantum dot array is initialized by ensuring that a desired number of charge carriers are present in each quantum dot and ensuring the initial spins of these charge carriers, spin manipulation may be carried out with either a single spin or pairs of spin or possibly larger numbers of spins. In some embodiments, single spins may be manipulated using electron spin resonance with a rotating magnetic field (perpendicular to its static field) and on resonance with the transition energy at which the spin flips.

Figure 4:
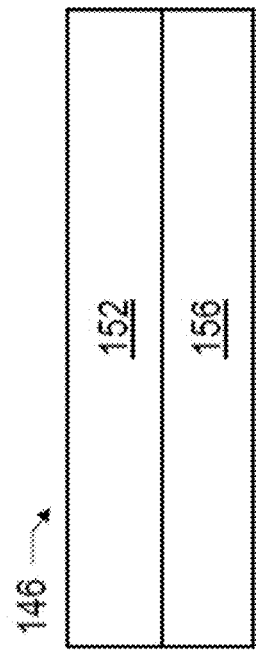
FIGS. 4-6 are cross-sectional views of various examples of quantum well stacks that may be used in a quantum dot device, according to some embodiments of the present disclosure.
Figure 5:
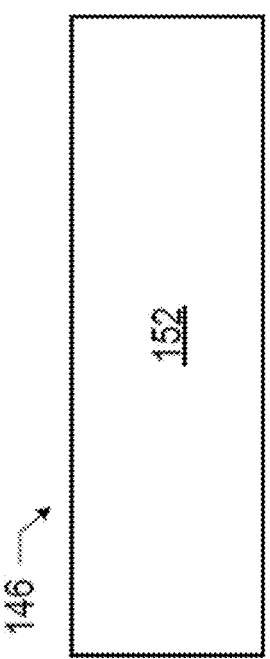
Figure 6:
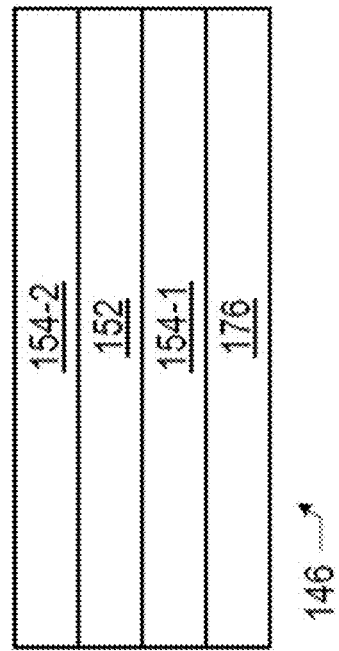

As discussed above, the base 102 and the fin 104 of a quantum dot device 100 may be formed from a semiconductor substrate 144 and a quantum well stack 146 disposed on the semiconductor substrate 144. The quantum well stack 146 may include a quantum well layer in which a 2DEG may form during operation of the quantum dot device 100. The quantum well stack 146 may take any of a number of forms, several of which are illustrated in FIGS. 4-6. The various layers in the quantum well stacks 146 discussed below may be grown on the semiconductor substrate 144 (e.g., using epitaxial processes).

FIG. 4 is a cross-sectional view of a quantum well stack 146 including only a quantum well layer 152. The quantum well layer 152 may be disposed on the semiconductor substrate 144, and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 4 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. In some such embodiments, the intrinsic silicon may be strained, while in other embodiments, the intrinsic silicon may not be strained. The thicknesses (i.e., z-heights) of the layers in the quantum well stack 146 of FIG. 4 may take any suitable values. For example, in some embodiments, the thickness of the quantum well layer 152 (e.g., intrinsic silicon) may be between 0.8 and 1.2 microns.

FIG. 5 is a cross-sectional view of a quantum well stack 146 including a quantum well layer 152 and a barrier layer 154. The quantum well stack 146 may be disposed on a semiconductor substrate 144 such that the barrier layer 154 is disposed between the quantum well layer 152 and the semiconductor substrate 144. The barrier layer 154 may provide a potential barrier between the quantum well layer 152 and the semiconductor substrate 144. As discussed above with reference to FIG. 4, the quantum well layer 152 of FIG. 5 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 5 may be formed of silicon, and the barrier layer 154 may be formed of silicon germanium. The germanium content of this silicon germanium may be 20-80% (e.g., 30%). The thicknesses (i.e., z-heights) of the layers in the quantum well stack 146 of FIG. 5 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon) may be between 5 and 30 nanometers.

FIG. 6 is a cross-sectional view of a quantum well stack 146 including a quantum well layer 152 and a barrier layer 154-1, as well as a buffer layer 176 and an additional barrier layer 154-2. The quantum well stack 146 may be disposed on the semiconductor substrate 144 such that the buffer layer 176 is disposed between the barrier layer 154-1 and the semiconductor substrate 144. The buffer layer 176 may be formed of the same material as the barrier layer 154, and may be present to trap defects that form in this material as it is grown on the semiconductor substrate 144. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The thicknesses (i.e., z-heights) of the layers in the quantum well stack 146 of FIG. 6 may take any suitable values. For example, in some embodiments, the thickness of the buffer layer 176 (e.g., silicon germanium) may be between 0.3 and 4 microns (e.g., 0.3-2 microns, or 0.5 microns). In some embodiments, the thickness of the barrier layer 154-1 (e.g., silicon germanium) may be between 0 and 400 nanometers. In some embodiments, the thickness of the quantum well layer 152 (e.g., silicon) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

As discussed above with reference to FIG. 5, the quantum well layer 152 of FIG. 6 may be formed of a material such that, during operation of the quantum dot device 100, a 2DEG may form in the quantum well layer 152 proximate to the upper surface of the quantum well layer 152. For example, in some embodiments in which the semiconductor substrate 144 is formed of silicon, the quantum well layer 152 of FIG. 6 may be formed of silicon, and the barrier layer 154-1 and the buffer layer 176 may be formed of silicon germanium. In some such embodiments, the silicon germanium of the buffer layer 176 may have a germanium content that varies from the semiconductor substrate 144 to the barrier layer 154-1. For example, the silicon germanium of the buffer layer 176 may have a germanium content that varies from zero percent at the silicon semiconductor substrate 144 to a nonzero percent (e.g., 30%) at the barrier layer 154-1. The barrier layer 154-1 may in turn have a germanium content equal to the nonzero percent. In other embodiments, the buffer layer 176 may have a germanium content equal to the germanium content of the barrier layer 154-1, but may be thicker than the barrier layer 154-1 so as to absorb the defects that may arise during growth. The barrier layer 154-2, like the barrier layer 154-1, may provide a potential energy barrier around the quantum well layer 152, and may take the form of any of the embodiments of the barrier layer 154-1. In some embodiments of the quantum well stack 146 of FIG. 6, the buffer layer 176 and/or the barrier layer 154-2 may be omitted.

The semiconductor substrate 144 and the quantum well stack 146 may be distributed between the base 102 and the fins 104 of the quantum dot device 100, as discussed above. This distribution may occur in any of a number of ways. For example, FIGS. 7-13 illustrate example base/fin arrangements 158 that may be used in a quantum dot device 100, in accordance with various embodiments.

Figure 7:
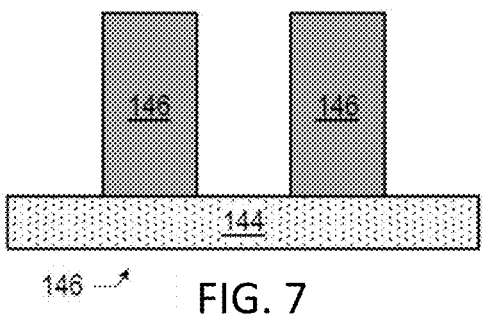
FIGS. 7-13 illustrate example base/fin arrangements that may be used in a quantum dot device, according to some embodiments of the present disclosure.

In the base/fin arrangement 158 of FIG. 7, the quantum well stack 146 may be included in the fins 104, but not in the base 102. The semiconductor substrate 144 may be included in the base 102, but not in the fins 104. Manufacturing of the base/fin arrangement 158 of FIG. 7 may include fin etching through the quantum well stack 146, stopping when the semiconductor substrate 144 is reached.

Figure 8:
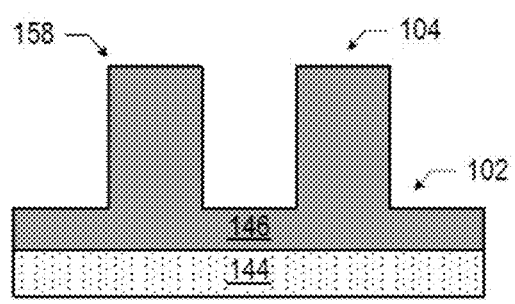
Figure 9:
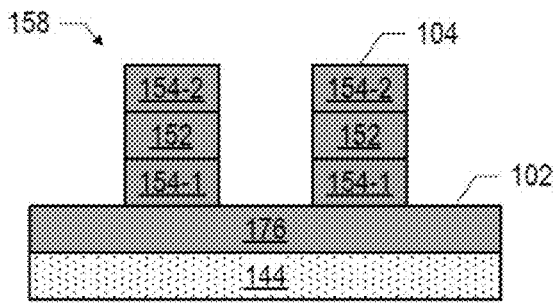

In the base/fin arrangement 158 of FIG. 8, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 8 may include fin etching that etches partially through the quantum well stack 146, and stops before the semiconductor substrate 144 is reached. FIG. 9 illustrates a particular embodiment of the base/fin arrangement 158 of FIG. 8. In the embodiment of FIG. 9, the quantum well stack 146 of FIG. 6 is used; the fins 104 include the barrier layer 154-1, the quantum well layer 152, and the barrier layer 154-2, while the base 102 includes the buffer layer 176 and the semiconductor substrate 144.

Figure 10:
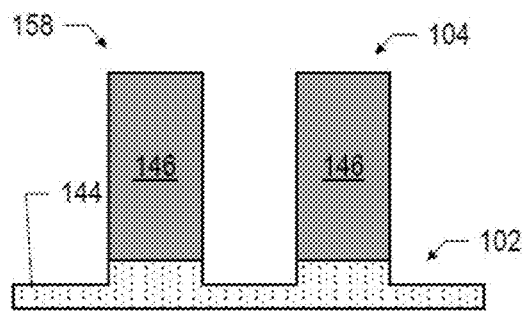
Figure 11:
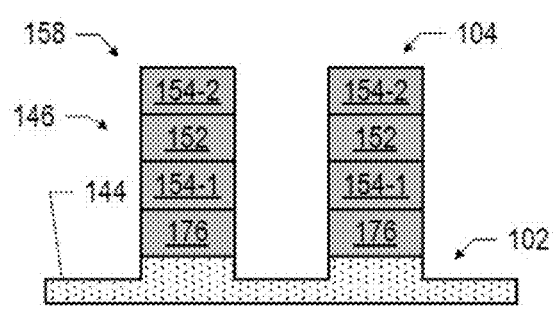

In the base/fin arrangement 158 of FIG. 10, the quantum well stack 146 may be included in the fins 104, but not the base 102. The semiconductor substrate 144 may be partially included in the fins 104, as well as in the base 102. Manufacturing the base/fin arrangement 158 of FIG. 10 may include fin etching that etches through the quantum well stack 146 and into the semiconductor substrate 144 before stopping. FIG. 11 illustrates a particular embodiment of the base/fin arrangement 158 of FIG. 10. In the embodiment of FIG. 11, the quantum well stack 146 of FIG. 6 is used; the fins 104 include the quantum well stack 146 and a portion of the semiconductor substrate 144, while the base 102 includes the remainder of the semiconductor substrate 144.

Figure 12:
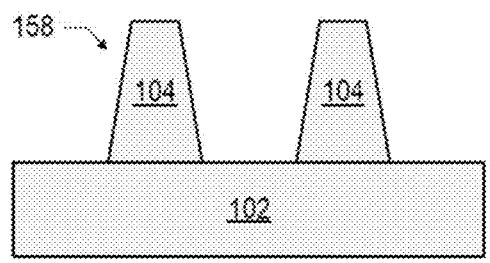

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 12, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 12. FIG. 13 illustrates a particular embodiment of the base/fin arrangement 158 of FIG. 12. In FIG. 13, the quantum well stack 146 is included in the tapered fins 104 while a portion of the semiconductor substrate 144 is included in the tapered fins and a portion of the semiconductor substrate 144 provides the base 102.

In the embodiment of the quantum dot device 100 illustrated in FIG. 2, the z-height of the gate metal 112 of the gates 108 may be approximately equal to the sum of the z-height of the gate metal 110 and the z-height of the hardmask 116, as shown. Also in the embodiment of FIG. 2, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

Example Quantum Circuit Components with Superconducting Qubits

Superconducting qubits are also promising candidates for building a quantum computer. Therefore, these are the types of qubit devices that may be used in a second example qubit device that may be used in a quantum circuit component to be operated and/or tested in a cooling apparatus with one or more triaxial cables as described herein, according to some embodiments of the present disclosure.

As shown in FIG. 14, an example superconducting quantum circuit 200 may include two or more qubits 202 (reference numerals following after a dash, such as e.g. qubit 202-1 and 202-2 indicate different instances of the same or analogous element). All of superconducting qubits operate based on the Josephson effect, which refers to a macroscopic quantum phenomenon of supercurrent, i.e. a current that, due to zero electrical resistance, flows indefinitely long without any voltage applied, across a non-linear inductive element such as a Josephson Junction. Josephson Junctions are integral building blocks in superconducting quantum circuits where they form the basis of quantum circuit elements that can approximate functionality of theoretically designed qubits. Therefore FIG. 14 illustrates that each of the superconducting qubits 202 may include one or more Josephson Junctions 204.

In general, a Josephson Junction includes two superconductors coupled by a so-called weak link that weakens the superconductivity between the two superconductors. In some embodiments, weak links of Josephson Junctions may be implemented by providing a thin layer of an insulating material, a conductive but not superconductive material, or a semiconducting material, typically referred to as a "barrier" or a "tunnel barrier," sandwiched, in a stack-like arrangement, between two layers of superconductor, which two superconductors typically referred to, respectively, as a "first electrode" and a "second electrode" of a Josephson Junction. Josephson Junction provides a non-linear inductive element to the circuit and allows the qubit to become an anharmonic oscillator. The anharmonicity is what allows the state of the qubit to be controlled to a high level of fidelity.

Typically, when a qubit employs only one Josephson Junction, a frequency of the qubit cannot be changed substantially beyond what is defined by the design unless one of the qubit capacitive elements is tunable. Employing two or more Josephson Junctions, e.g. arranged in a so-called superconducting quantum interference device (SQUID), allows controlling the frequency of the qubit, which, in turn, allows greater control as to whether and when the qubit interacts with other components of a quantum circuit, e.g. with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing DC or a pulse of current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies.

Turning back to FIG. 14, within each qubit 202, the one or more Josephson Junctions 204 may be directly electrically connected to one or more other circuit elements 206, which, in combination with the Josephson Junction(s) 204, form a non-linear oscillator circuit providing multi-level quantum system where the first two to three levels define the qubit under normal operation. The circuit elements 206 could be e.g. shunt capacitors, superconducting loops of a SQUID, electrodes for setting an overall capacitance of a qubit, or/and ports for capacitively coupling the qubit to one or more of a readout resonator, a coupling or "bus" component, and a direct microwave drive line, or electromagnetically coupling the qubit to a flux bias line.

As also shown in FIG. 14, an example superconducting quantum circuit 200 may include means 208 for providing external control of qubits 202 and means 210 for providing internal control of qubits 202. In this context, "external control" refers to controlling the qubits 202 from outside of, e.g. an IC chip comprising the qubits, including control by a user of a quantum computer, while "internal control" refers to controlling the qubits 202 within the IC chip. For example, if qubits 202 are transmons, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 202, the external control means 208, and the external control means 210 of the quantum circuit 200 may be provided on, over, or at least partially embedded in a substrate (not shown in FIG. 14).

FIG. 15 provides a schematic illustration of an example physical layout of a superconducting quantum circuit 211 where qubits are implemented as transmons, according to some embodiments of the present disclosure.

Similar to FIG. 14, FIG. 15 illustrates two qubits 202. In addition, FIG. 15 illustrates flux bias lines 212, microwave lines 214, a coupling resonator 216, a readout resonator 218, and connections (e.g. wirebonding pads or any other suitable connections) 220 and 222. The flux bias lines 212 and the microwave lines 214 may be viewed as examples of the external control means 208 shown in FIG. 14. The coupling resonator 216 and the readout resonator 218 may be viewed as examples of the internal control means 210 shown in FIG. 14.

Running a current through the flux bias lines 212, provided from the connections 220, allows tuning (i.e. changing) the frequency of the corresponding qubits 202 to which each line 212 is connected. In general, it operates in the following manner. As a result of running the current in a particular flux bias line 212, magnetic field is created around the line. If such a magnetic field is in sufficient proximity to the qubit 202, e.g. by a portion of the flux bias line 212 being provided next to the qubit 202, the magnetic field couples to the qubit, thereby changing the spacing between the energy levels of the qubit. This, in turn, changes the frequency of the qubit since the frequency is directly related to the spacing between the energy levels via Planck's equation. The Planck's equation is $E=h\nu$, where E is the energy (in this case the energy difference between energy levels of a qubit), h is the Planck's constant and $\nu$ is the frequency (in this case the frequency of the qubit). As this equation illustrates, if E changes, then $\nu$ changes. Provided there is sufficient multiplexing, different currents can be sent down each of the flux lines allowing for independent tuning of the various qubits.

Typically, the qubit frequency may be controlled in order to bring the frequency either closer to or further away from another resonant item, for example a coupling resonator such as 216 shown in FIG. 15 that connects two or more qubits together, as may be desired in a particular setting.

For example, if it is desirable that a first qubit 202 (e.g. the qubit 202 shown on the left side of FIG. 15) and a second qubit 202 (e.g. the qubit 202 shown on the right side of FIG. 15) interact, via the coupling resonator 216 connecting these qubits, then both qubits 202 may need to be tuned to be at nearly the same frequency. One way in which such two qubits could interact is that, if the frequency of the first qubit 202 is tuned very close to the resonant frequency of the coupling resonator 216, the first qubit can, when in the excited state, relax back down to the ground state by emitting a photon (similar to how an excited atom would relax) that would resonate within the coupling resonator 216. If the second qubit 202 is also at this energy (i.e. if the frequency of the second qubit is also tuned very close to the resonant frequency of the coupling resonator 216), then it can absorb the photon emitted from the first qubit, via the coupling resonator 216, and be excited from its ground state to an excited state. Thus, the two qubits interact in that a state of one qubit is controlled by the state of another qubit. In other scenarios, two qubits could interact via a coupling resonator at specific frequencies, but these three elements do not have to be tuned to be at nearly the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator. If there is nowhere for such a frequency-detuned photon to go, the qubit will be better isolated from its surroundings and will live longer in its current state. Thus, in general, two or more qubits could be configured to avoid or eliminate interactions with one another by tuning their frequencies to specific values or ranges.

The state(s) of each qubit 202 may be read by way of its corresponding readout resonator 218. As explained below, the qubit 202 induces a resonant frequency in the readout resonator 218. This resonant frequency is then passed to the microwave lines 214 and communicated to the pads 222.

To that end, a readout resonator 218 may be provided for each qubit. The readout resonator 218 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 218 is coupled to the qubit by being in sufficient proximity to the qubit 202, more specifically in sufficient proximity to the capacitor of the qubit 202, when the qubit is implemented as a transmon, either through capacitive or inductive coupling. Due to a coupling between the readout resonator 218 and the qubit 202, changes in the state of the qubit 202 result in changes of the resonant frequency of the readout resonator 218. In turn, because the readout resonator 218 is in sufficient proximity to the microwave line 214, changes in the resonant frequency of the readout resonator 218 induce changes in the current in the microwave line 214, and that current can be read externally via the wire bonding pads 222.

The coupling resonator 216 allows coupling different qubits together, e.g. as described above, in order to realize quantum logic gates. The coupling resonator 216 is similar to the readout resonator 218 in that it is a transmission line that includes capacitive connections to ground on both sides (i.e. a half wavelength resonator), which also results in oscillations within the coupling resonator 216. Each side of the coupling resonator 216 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 216 has coupling with a respective different qubit, the two qubits are coupled together through the coupling resonator 216. In this manner, state of one qubit depends on the state of the other qubit, and the other way around. Thus, coupling resonators may be employed in order to use a state of one qubit to control a state of another qubit.

In some implementations, the microwave line 214 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 214 shown in FIG. 15 may be used to only readout the state of the qubits as described above, while separate drive lines such as e.g. drive lines 224 shown in FIG. 15, may be used to control the state of the qubits. In such implementations, the microwave lines used for readout may be referred to as readout lines (e.g. readout line 214), while microwave lines used for controlling the state of the qubits may be referred to as drive lines (e.g. drive lines 224). The drive lines 224 may control the state of their respective qubits 202 by providing, using e.g. connections 226 as shown in FIG. 15, a microwave pulse at the qubit frequency, which in turn stimulates (i.e. triggers) a transition between the states of the qubit. By varying the length of this pulse, a partial transition can be stimulated, giving a superposition of the states of the qubit.

Coupling resonators and readout resonators of the superconducting quantum circuit 200 or 211 may be configured for capacitive coupling to other circuit elements at one or both ends in order to have resonant oscillations, whereas flux bias lines and microwave lines are intended to be non-resonant microwave transmission lines. In general, a resonator of a quantum circuit differs from a non-resonant microwave transmission line in that a resonator is a transmission line that is deliberately designed to support resonant oscillations (i.e. resonance) within the line, under certain conditions. In contrast, non-resonant transmission lines may be similar to conventional microwave transmission lines in that they are designed to avoid resonances, especially resonances at frequencies/wavelengths close to the resonant frequencies/wavelengths of any resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible. For example, the ends of non-resonant transmission lines are typically engineered to have a specific impedance (e.g. substantially 50 Ohm) to minimize impedance mismatches to other circuit elements to which the lines are connected, in order to minimize the amount of reflected signal at transitions (e.g., transitions from the chip to the package, the package to the connector, etc.).

Each one of the resonators and non-resonant transmission lines of a superconducting quantum circuit may be implemented as any suitable architecture of a microwave transmission line, such as e.g. a coplanar waveguide, a stripline, a microstrip line, or an inverted microstrip line. Typical materials to make the lines and resonators include Al, Nb, NbN, TiN, MoRe, and NbTiN, all of which are particular types of superconductors. However, in various embodiments, other suitable superconductors and alloys of superconductors may be used as well.

In various embodiments, various lines and qubits shown in FIG. 15 could have shapes and layouts different from those shown in that FIG. For example, some lines or resonators may comprise more curves and turns while other lines or resonators may comprise less curves and turns, and some lines or resonators may comprise substantially straight lines. In some embodiments, various lines or resonators may intersect one another, in such a manner that they don't make an electrical connection, which can be done by using e.g. a bridge, bridging one interconnect over the other. As long as these lines and resonators operate in accordance with use of such lines and resonators as known in the art for which some example principles were described above, quantum circuits with different shapes and layouts of the lines, resonators and qubits than those illustrated in FIG. 15 are all within the scope of the present disclosure.

While FIGS. 14 and 15 illustrate examples of quantum circuits comprising only two qubits 202, embodiments with any larger number of qubits are possible and are within the scope of the present disclosure. Furthermore, while FIGS. 14 and 15 illustrate embodiments specific to transmons, subject matter disclosed herein is not limited in this regard and may include other embodiments of quantum circuits implementing other types of superconducting qubits that would also utilize Josephson Junctions as described herein, all of which are within the scope of the present disclosure.

A quantum circuit component to be operated and/or tested in a cooling apparatus with one or more triaxial cables as described herein may include one or more of the superconducting qubit devices 202.

Figure 16:
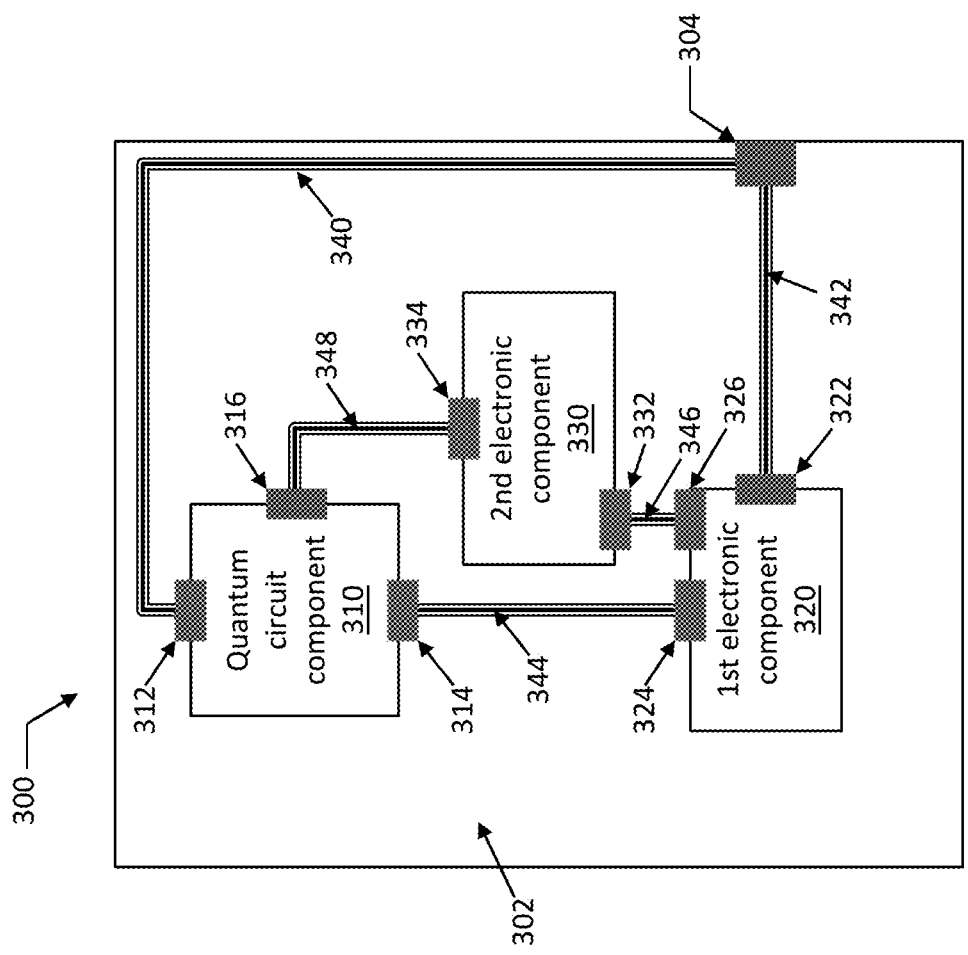
FIG. 16 provides a schematic illustration of a cooling apparatus that utilizes one or more triaxial cables to provide signals to a quantum circuit component, according to some embodiments of the present disclosure.

Implementing Triaxial Cables within a Cooling Apparatus for Quantum Circuit Components FIG. 16 provides a schematic illustration of a cooling apparatus 300 that utilizes one or more triaxial cables to provide signals to a quantum circuit component 310, according to some embodiments of the present disclosure.

The quantum circuit component 310 may include a die with any combination of one or more qubit devices, e.g. any one or more of the quantum dot qubits or superconducting qubits as described above. In general, the term "die" refers to a small block of semiconductor material/substrate on which a particular functional circuit is fabricated. On the other hand, an IC chip, also referred to as simply a chip or a microchip, sometimes refers to a semiconductor wafer on which thousands or millions of such devices or dies are fabricated. However, other times, an IC chip refers to a portion of a semiconductor wafer (e.g. after the wafer has been diced) containing one or more dies, or the terms "chip"

and "die" are used interchangeably. The quantum circuit component 310 may be any component that includes one or more, typically a plurality, of qubits which may be used to perform quantum circuit processing operations. For example, the quantum circuit component 310 may include one or more quantum dot devices 100 or one or more devices 200 or 211 implementing superconducting qubits. However, in general, the quantum circuit component 310 may include any type of qubits, all of which are within the scope of the present disclosure. The quantum circuit component 310 may be a part of a quantum processing device, e.g. a part of a quantum processing device 2026 described with reference to FIG. 19.

The cooling apparatus 300 may be e.g. a dilution refrigerator, a helium-3 refrigerator, or a liquid helium refrigerator. The cooling apparatus 300 may maintain the quantum circuit component 310 at a predetermined low temperature during operation to avoid qubit decoherence and to reduce the effects of scattering in the quantum circuit component 310. This predetermined low temperature may vary depending on the setting; in some embodiments, the temperature may be 5 degrees Kelvin or less. The cooling apparatus 300 may be a cooling apparatus 2024 described with reference to FIG. 19.

In some embodiments, the cooling apparatus 300 may further include one or more electronic components, with the example embodiment shown in FIG. 16 illustrating two electronic components labeled as a first electronic component 320 and a second electronic component 330. As used herein, "electronic component" refers to a non-quantum electronic component, such as e.g. an attenuator, a filter, or an amplifier. In other embodiments, the cooling apparatus 300 may not include one or both of the first and second electronic components 320, 330.

In various embodiments, there may be two or more of triaxial connectors included in various components of the cooling apparatus 300, including the quantum circuit component 310 placed therein for testing or/and operation. A "triaxial connector" refers to a connector that may be used at a port of one device to electrically couple that device to another device using a triaxial cable. The other device would also then have a corresponding triaxial connector, hence at least two different triaxial connectors may be included within the cooling apparatus 300. The example embodiment shown in FIG. 16 illustrates a triaxial connector 304 at an input/output (I/O) port of the cooling apparatus 300, three triaxial connectors 312, 314, and 316 at different ports of the quantum circuit component 310, three triaxial connectors 322, 324, and 326 at different ports of the first electronic component 320, and two triaxial connectors 332 and 334 at different ports of the second electronic component 330. The example embodiment shown in FIG. 16 further illustrates triaxial cables 340, 342, 344, 346, and 348 between various pairs of the triaxial connectors shown in that FIG. However, in other embodiments, more triaxial connectors, less triaxial connectors, or triaxial cables provided in different configurations than that shown in the example of FIG. 16 may be used, as long as there is at least one triaxial cable is used to couple at least two different components within the cooling apparatus 300, all of which being within the scope of the present disclosure.

In general, a triaxial connector, e.g. any of the triaxial connectors employed within the cooling apparatus 300 shown in FIG. 16, includes a signal connector for receiving a signal conductor of a triaxial cable (e.g. any of the triaxial cables employed within the cooling apparatus 300 shown in FIG. 16), a first shield connector for receiving a first shield conductor of the triaxial cable, and a second shield connector for receiving a second shield conductor of the triaxial cable. The first shield connector surrounds the signal connector and, in some embodiments, may be coaxial with the signal connector. The second shield connector surrounds the first shield connector and, in some embodiments, may be coaxial with the signal connector and/or with the first shield connector. The signal connector and the first shield connector may be separated by a dielectric medium, such as e.g. air, vacuum, or any solid dielectric material, e.g., perfluoroalkoxy (PFA), Teflon, polytetrafluoroethylene (PTFE), fluorinated ethylene propylene (FEP), graphite coated FEP, graphite coated PTFE, etc. Similarly, the first shield connector and the second shield connector may be separated by a dielectric medium, which may be the same or different from the dielectric medium separating the signal connector and the first shield connector.

Figure 17:
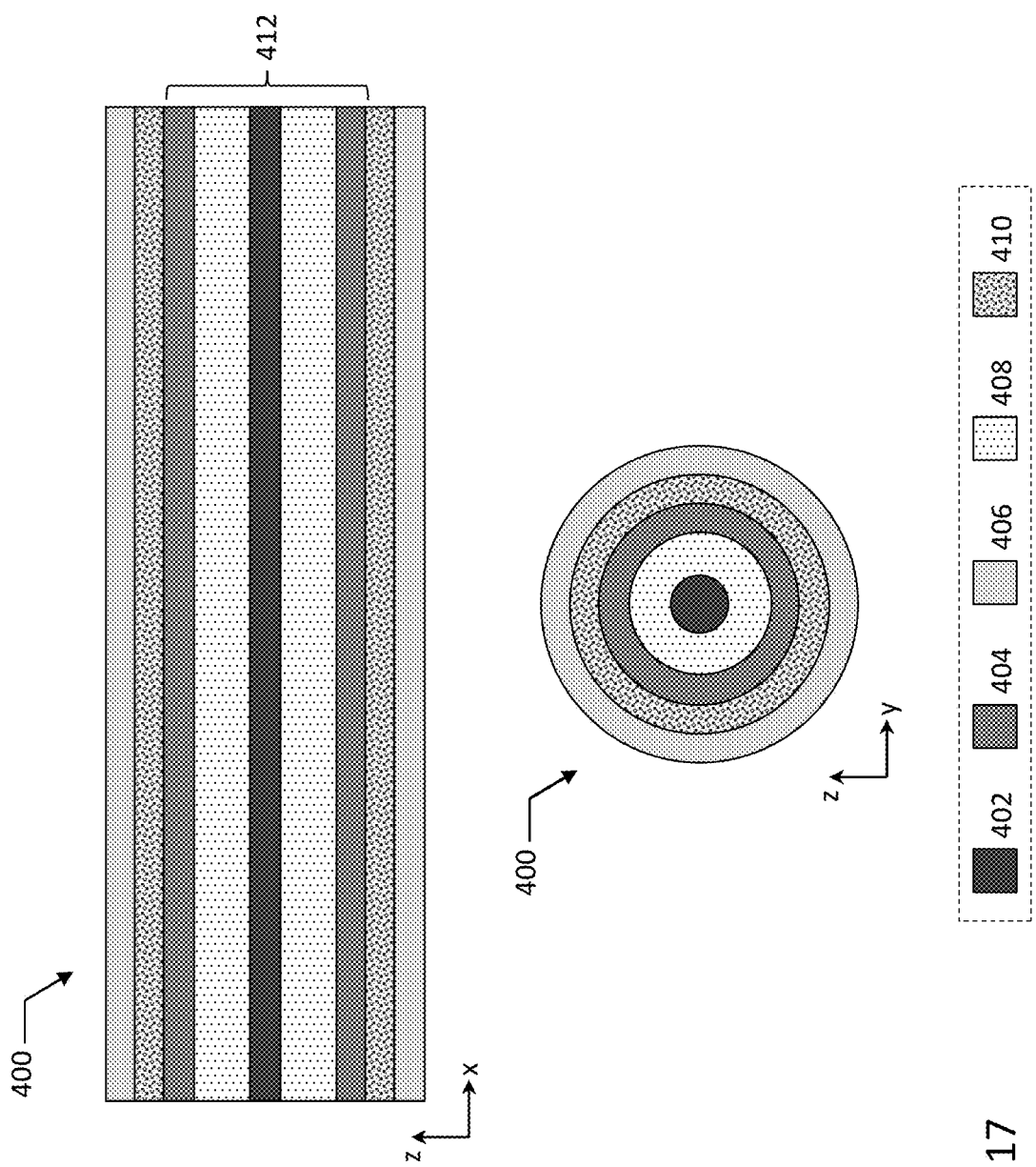
FIG. 17 provides a schematic illustration a cross-sectional side view of an example triaxial cable, according to some embodiments of the present disclosure.

In general, a triaxial cable, e.g. any of the triaxial connectors employed within the cooling apparatus 300 shown in FIG. 16, may be implemented as a triaxial cable 400 shown in FIG. 17. FIG. 17 illustrates two example views of the triaxial cable 400—the top view shown in FIG. 17 is a longitudinal section along the length of the triaxial cable 400 (along the long axis of the cable 400), while the bottom view shown in FIG. 17 is a cross-section along a plane perpendicular to the long axis of the cable 400. As shown in FIG. 17, the triaxial cable 400 includes a signal conductor 402, a first shield conductor 404, a second shield conductor 406, a first insulator 408, and a second insulator 410. The different ones of elements 402-410 are shown in FIG. 17 with different patterns, with a correspondence between different patterns and reference numerals indicated within the dashed box provided at the bottom of FIG. 17. As shown in FIG. 17, the first insulator 408 surrounds the signal conductor 402, at least partially, along at least a portion of the signal conductor 402; the first shield conductor 404 surrounds the first insulator 408, at least partially, along at least a portion of the signal conductor 402 (or, interchangeably, along at least a portion of the first shield conductor 404); the second insulator 410 surrounds the first shield conductor 404, at least partially, along at least a portion of the signal conductor 402; and the second shield conductor 406 surrounds the second insulator 410, at least partially, along at least the portion of the signal conductor 402. In some embodiments, the first shield conductor 404 may be coaxial with at least a portion of the signal conductor 402. In some embodiments, the second shield conductor 406 may be coaxial with at least a portion of the signal conductor 402 and/or at least a portion of the first shield conductor 404. While FIG. 17 illustrates the triaxial cable 400 as having a substantially circular cross-sectional shape, in other embodiments, the cross-sectional shape may be different, e.g. a square, an oval, or any other suitable shape.

Since the triaxial cables and the triaxial connectors described herein are to be used within the cooling apparatus 300, they have to be operable at very low temperatures at which qubit devices are to be kept. This, together with the unique nature of the qubit devices where e.g. very low currents need to be provided and/or detected, places unique requirements on the selection of the materials and the design of such cables and connectors, which requirements are typically not present when triaxial cables and connectors are used with room temperature, conventional, electronics.

One example of such requirements for the triaxial cable 400 is that one or more of, but preferably all of, the signal conductor 402, the first shield conductor 404, and the second shield conductor 406 are made of one or more superconducting or normal (i.e. not superconducting) metals which are configured to reduce the heat load at low temperatures. To that end, electrically conductive materials with low thermal conductivity are selected, e.g. materials having thermal conductivity below about between about $5 \cdot 10^4$ watts per centimeter-kelvin (W*cm/K), e.g. materials having thermal conductivity between about $5 \cdot 10^{-6}$ W*cm/K and $5 \cdot 10^{-4}$ W*cm/K. Examples of normal conductors that have such thermal conductivity and, therefore, may be considered as being configured to reduce the heat load at low temperatures, include cupronickel (CuNi), stainless steel (SS), beryllium copper (BeCu), phosphor bronze, and brass. Examples of superconductors that have such thermal conductivity include niobium and niobium titanium. Typical thermal conductivity of the conductors ranges from. In some embodiments, any pair of the signal conductor 402, the first shield conductor 404, and the second shield conductor 406 may include the same materials. In other embodiments, materials of two or more of the signal conductor 402, the first shield conductor 404, and the second shield conductor 406 may be different.

Similarly, the first and second insulators 408, 410 of the triaxial cable 400 may be selected so that they have a relatively high low temperature toughness (i.e. do no physically degrade with symptoms such as cracking and embrittlement). The first and second insulators 408, 410 preferably include materials which can operate in cryogenic temperatures without, or with minimal, degradation after many thermal cycles. Furthermore, especially for operational or measurement environments with vibrations, selected insulator material may be coated with a conductive material such as graphite to minimize noise derived from the triboelectric effect. In some embodiments, the first and second insulators 408, 410 may be selected as any suitable dielectric medium as described above for the dielectric medium between the signal, first shield, and second shield connectors of a triaxial connector, i.e. any one or more of PFA, Teflon, PTFE, FEP, graphite coated FEP, and graphite coated PTFE. In some embodiments, the first and second insulators 408, 410 may have a thickness that is substantially the same. In other embodiments, their thicknesses may be different. In some embodiments, the first and second insulators 408, 410 may include substantially the same materials. In other embodiments, the first and second insulators 408, 410 may include different materials.

Examples of Signals Supported by Triaxial Cables and Triaxial Connectors for Qubits As described above, each of the components present within the cooling apparatus 300 may include corresponding zero or more triaxial connectors. For example, in some embodiments, the quantum circuit component 310 may include one or more of the triaxial connectors 312, 314, and 316. In another example, in some embodiments, the first electronic component 320 may include one or more of the triaxial connectors 322, 324, and 326. In yet another example, in some embodiments, the second electronic component 330 may include one or more of the triaxial connectors 332, and 334. When at least one triaxial cable is used between any pair of respective triaxial connectors, various signals may be provided to, or received from, the qubit device(s) of the quantum circuit component 310 (with the triaxial cable(s) and triaxial connector(s) configured to support provision of such signals). The type of signals would depend on the type of the qubit device involved, some examples of which will now be described.

In a first example, when a given qubit device of the quantum circuit component 310 includes at least one quantum dot qubit device that includes at least one plunger gate, one or more triaxial cables in the cooling apparatus 300 (and corresponding triaxial connectors) may support provision to the quantum circuit component 310 of at least one plunger voltage to be applied to the at least one plunger gate to control formation of one or more quantum dots in the qubit device. In various embodiments of the first example, the at least one plunger voltage may be provided from the I/O port of the cooling apparatus 300, or from the first electronic component 320, or from the second electronic component 330.

In a second example, when a given qubit device of the quantum circuit component 310 includes at least one quantum dot qubit device that includes two or more plunger gates and a barrier gate, one or more triaxial cables in the cooling apparatus 300 (and corresponding triaxial connectors) may support provision to the quantum circuit component 310 of at least one barrier voltage to be applied to the barrier gate to control a potential barrier between two adjacent plunger gates of the two or more plunger gates. In various embodiments of the second example, the at least one barrier voltage may be provided from the I/O port of the cooling apparatus 300, or from the first electronic component 320, or from the second electronic component 330.

In a third example, when a given qubit device of the quantum circuit component 310 includes at least one quantum dot qubit device that includes at least one plunger gate, at least one barrier gate, and at least one accumulation gate, one or more triaxial cables in the cooling apparatus 300 (and corresponding triaxial connectors) may support provision to the quantum circuit component 310 of at least one barrier voltage to be applied to the at least one barrier gate to control a potential barrier between the at least one plunger gate and an adjacent one of the at least one accumulation gate. In various embodiments of the third example, the at least one barrier voltage may be provided from the I/O port of the cooling apparatus 300, or from the first electronic component 320, or from the second electronic component 330.

In a fourth example, when a given qubit device of the quantum circuit component 310 includes at least one quantum dot qubit device that includes at least one accumulation gate, one or more triaxial cables in the cooling apparatus 300 (and corresponding triaxial connectors) may support provision to the quantum circuit component 310 of at least one accumulation voltage to be applied to the at least one accumulation gate to control a number of charge carriers in an area between an area where one or more quantum dots are to be formed and a charge carrier reservoir. In various embodiments of the fourth example, the at least one accumulation voltage may be provided from the I/O port of the cooling apparatus 300, or from the first electronic component 320, or from the second electronic component 330.

In a fifth example, when a given qubit device of the quantum circuit component 310 includes at least one superconducting qubit device that includes at least one flux bias line (e.g. any one of the superconducting qubit devices described above), one or more triaxial cables in the cooling apparatus 300 (and corresponding triaxial connectors) may support provision to the quantum circuit component 310 of a current for the at least one flux bias line. In various embodiments of the fifth example, the current may be provided from the I/O port of the cooling apparatus 300, or from the first electronic component 320, or from the second electronic component 330.

In a sixth example, when a given qubit device of the quantum circuit component 310 includes at least one superconducting qubit device that includes at least one microwave drive line (e.g. any one of the superconducting qubit devices described above), one or more triaxial cables in the cooling apparatus 300 (and corresponding triaxial connectors) may support provision to the quantum circuit component 310 of a current for the at least one microwave drive. In various embodiments of the sixth example, the current may be provided from the I/O port of the cooling apparatus 300, or from the first electronic component 320, or from the second electronic component 330.

In other examples, for various types of qubit devices of the quantum circuit component 310, one or more triaxial cables in the cooling apparatus 300 (and corresponding triaxial connectors) may support provision of direct current to the quantum circuit component 310. In various embodiments, the direct current may be provided from the I/O port of the cooling apparatus 300, or from the first electronic component 320, or from the second electronic component 330.

Converting Coaxial Connections to Triaxial Connections

Conventional cooling apparatuses used to keep qubits at low temperatures use coaxial cables. Installing triaxial cables may require significant development time and effort. Therefore, according to some embodiments of the present disclosure, at least some, or all, of the triaxial cables used within the cooling apparatus 300 may be cables that have been upgraded, or converted, from conventional coaxial cables typically used in such apparatuses. For example, the triaxial cable 400 may be seen as a coaxial cable 412 (i.e. a cable that includes the signal conductor 402, the first insulator 408, and the first shield conductor 404, as described above) having a conversion structure provided thereon to form a triaxial cable, the conversion structure including the second insulator 410 and the second shield conductor 406. In some embodiments, the conversion structure may be such that the second shield conductor 406 can be attached to the first shield conductor 404, with the insulator in between. In some embodiments the second shield conductor 406 may be connected to a coaxial shield source while the first shield conductor 404 may be left disconnected in order to avoid shorting the guard operating in the triaxial cable. In other embodiments, the conversion structure may be such that the second shield conductor 406 may be placed around the second insulator 410 once the second insulator 410 has been placed around the first shield conductor 404. In some embodiments, the second insulator 410 may be configured to be snapped on the first shield conductor 404 of an existing coaxial cable. In some embodiments, the first shield conductor 404 may be operated as a driven guard and be connected to the shield of a coaxial cable to still provide shielding to the signal conductor 402.

In other embodiments, a coaxial cable may be converted to a triaxial cable to obtain the triaxial cable 400 for use within the cooling apparatus 300 using push-to-connect, threaded connectors, or different variants of a breakout box.

In some embodiments, a method of operating an assembly that includes a quantum circuit component comprising at least one qubit device, e.g. the quantum circuit component 310, an electronic component (e.g. the first or second electronic components 320, 330, or the connector of the I/O port of the cooling apparatus 300), and a coaxial cable configured to couple the quantum circuit component and the electronic component may include converting the coaxial cable to the triaxial cable. Such a conversion may include providing an insulator to at least partially surround the coaxial cable, and providing an additional shield conductor to at least partially surround the insulator. The method may further include driving what was originally the shield conductor of the coaxial cable as a guard, and connecting the additional shield conductor provided to surround the additional insulator to ground potential.

Coupling Various Components with Triaxial Cables

Turning back to FIG. 16, as described above, the cooling apparatus 300 could include at least one triaxial cable used to couple at least two different components placed therein (e.g. the quantum circuit component 310 placed in a cooling chamber of the cooling apparatus 300) or built in therein (e.g. the first or second electronic components 320, 330, o the triaxial connector 304 at the I/O port of the cooling apparatus 300). The various examples of triaxial cables shown in FIG. 16 will now be described but, again, in other embodiments of the cooling apparatus 300 more or less of such triaxial cables may be included.

As shown in FIG. 16, in some embodiments, the triaxial cable 340 may be used to directly couple the triaxial connector 304 at the I/O port of the cooling apparatus 300 to a corresponding triaxial connector 312 of the quantum circuit component 310. In other words, in some embodiments, the cooling apparatus 300 may include a triaxial cable coupling the I/O of the cooling apparatus 300 with the quantum circuit component 310 without any intervening components. Such embodiments may be used for, e.g., providing DC signals such as source, drain, plunger, barrier, and accumulation gate voltages and currents. In various embodiments, the absolute values of DC currents provided over the triaxial cable 340 may range from about $1 \cdot 10^{-15}$ ampere (A) (i.e. very low currents which were not possible to differentiate using conventional coaxial cables) to about $1 \cdot 10^{-3}$ A, while the absolute values of DC voltages provided over the triaxial cable 340 may range from 0 to 20 volts (V). In some embodiments, the triaxial cable 340 may be used to supply alternating current (AC) signals to transmission lines, plunger and barrier gates, and single electron transistors that may be used in the quantum circuit component 310. In such embodiments, AC signal frequencies may range from DC to about 30 GHz, e.g. with powers ranging from −100 to 0 decibel-milliwatt (dBm). If the triaxial cable 340 is used to measure DC leakage of the various gates of quantum dot qubit devices as described above, current levels that may be detected using the triaxial cable 340 may be below about $1 \cdot 10^{-12}$ A, e.g. may range from about $1 \cdot 10^{-15}$ A to about $1 \cdot 10^{-7}$ A. In other embodiments, a single electron transistor, which is part of the quantum dot device 100 and acts as a charge sensor for qubit states, may be used as a charge sensor with RF reflectometry using a bandwidth ranging from 0.1 kHz to 1 MHz.

On the other hand, in other embodiments, the I/O port of the cooling apparatus 300 may be coupled to the quantum circuit component 310 via an intervening other component, e.g. the first electronic component 320. In some such embodiments, each pair may be coupled by a respective triaxial cable: the triaxial connector 304 of the I/O port of the cooling apparatus 300 may be coupled with a corresponding first triaxial connector 322 of the first electronic component 320 using the triaxial cable 342, and a second triaxial connector 324 of the first electronic component 320 may be coupled with a corresponding triaxial connector 314 of the quantum circuit component 310 using the triaxial cable 344. Such embodiments may be particularly advantageous because integrity of the signals transferred between each of these pairs may be preserved by using a respective triaxial cable for each pair. In other embodiments, only the triaxial connector 304 of the I/O port of the cooling apparatus 300 may be coupled with a corresponding first triaxial connector 322 of the first electronic component 320 using the triaxial cable 342, while the first electronic component 320 may be coupled with the quantum circuit component 310 using any suitable conventional cable, e.g., a coaxial cable (not specifically shown in FIG. 16). In such embodiments, the triaxial connectors 324 and 314, and the triaxial cable 344 shown in FIG. 16 could be replaced with conventional connectors and cables, respectively, e.g. with coaxial connectors and a coaxial cable. In still other embodiments, only the second triaxial connector 324 of the first electronic component 320 may be coupled with a corresponding triaxial connector 314 of the quantum circuit component 310 using the triaxial cable 344, while the I/O port of the cooling apparatus 300 may be coupled to the first electronic component 320 using any suitable conventional cable, e.g., a coaxial cable (not specifically shown in FIG. 16). In such embodiments, the triaxial connectors 304 and 322, and the triaxial cable 342 shown in FIG. 16 could be replaced with conventional connectors and cables, respectively, e.g. with coaxial connectors and a coaxial cable. The latter two embodiments (i.e. when only one pair is coupled using a triaxial connector) may be advantageous because they make implementation easier, while still maintaining adequate integrity of the signals transferred between the I/O port of the cooling apparatus 300 and the quantum circuit component 310 because a triaxial cable is used for at least one link on the path between these two elements.

In various other embodiments where the I/O port of the cooling apparatus 300 is coupled to the quantum circuit component 310 via an intervening other component, e.g. the first electronic component 320, the direct coupling between the I/O port of the cooling apparatus 300 and the quantum circuit component 310 may be absent, or it may be present but use any other non-triaxial cable (and corresponding connectors) and not use the triaxial cable 340. Also in various other embodiments where the I/O port of the cooling apparatus 300 is coupled to the quantum circuit component 310 via an intervening other component, e.g. the first electronic component 320, the second electronic component 330 may be present but not coupled with any triaxial cables, or may be absent altogether.

In some embodiments where the I/O port of the cooling apparatus 300 is coupled to the quantum circuit component 310 via the first electronic component 320, the first electronic component 320 may be an attenuator used for attenuation of an incoming signal, e.g. to attenuate a signal provided from an external component to the I/O port of the cooling apparatus 300. In various embodiments, the attenuator may be configured to thermally anchor the cable 342 (i.e. to physically connect two materials together so heat transfer may occur, which is accomplished at various temperature stages of a dilution fridge to reduce demand of cooling power from incoming signal wires and maintain the desired electron temperature of the quantum circuit component 310) and/or to attenuate the power of the incoming signal before the signal reaches the quantum circuit component 310 (which attenuation may be carried out in combination with thermal anchoring). In other embodiments, the first electronic component 320 may represent an amplifier that receives a signal that has been attenuated by virtue of being transmitted via the triaxial cable 342, and amplifies it to a range that is suitable for use by the quantum circuit component 310 for operation of a transmission line, strip line, single electron transistor, and/or plunger and barrier gates. In some embodiments, signals directly retrieved and/or transmitting to and from 310 via the first electronic component 320 may represent DC voltages used to control various gates such as accumulation, plunger, and/or barrier gates.

Still in other embodiments, the I/O port of the cooling apparatus 300 may be coupled to the quantum circuit component 310 via two or more intervening other components, e.g. the first and second electronic components 320, 330. In some such embodiments, each pair may be coupled by a respective triaxial cable: the triaxial connector 304 of the I/O port of the cooling apparatus 300 may be coupled with a corresponding first triaxial connector 322 of the first electronic component 320 using the triaxial cable 342, another triaxial connector 326 of the first electronic component 320 may be coupled with a corresponding triaxial connector 332 of the second electronic component 330 using the triaxial cable 346, and another triaxial connector 334 of the second electronic component 330 may be coupled with a corresponding triaxial connector 316 of the quantum circuit component 310 using the triaxial cable 348. Such embodiments may be particularly advantageous because integrity of the signals transferred between each of these pairs may be preserved by using a respective triaxial cable for each pair. In other embodiments, only any one or any two of the triaxial cables 342, 346, and 348 may be used to couple various pairs of the I/O port of the cooling apparatus 300, the first electronic component 320, the second electronic component 330, and the quantum circuit component 310. In such embodiments, when any of the triaxial cables 342, 346, and 348 shown in FIG. 16 are not used, the cables and the corresponding connectors may be replaces with any suitable conventional cables and connectors, e.g., coaxial cables and coaxial connectors (not specifically shown in FIG. 16).

In various embodiments when the I/O port of the cooling apparatus 300 is coupled to the quantum circuit component 310 via two or more intervening other components, e.g. the first and second electronic components 320, 330, the direct coupling between the I/O port of the cooling apparatus 300 and the quantum circuit component 310 may be absent, or it may be present but use any other non-triaxial cable (and corresponding connectors) and not use the triaxial cable 340.

Some embodiments where the I/O port of the cooling apparatus 300 is coupled to the quantum circuit component 310 via the first electronic component 320 that is coupled to the second electronic component 330 may be used for amplification of an RF signal after attenuation and/or thermal anchoring by the first electronic component 320, i.e. the second electronic component 330 may be a suitable amplifier. In some embodiments, the second component 330 may be an attenuator to reduce the incident power to the quantum circuit component 310 so the electron temperature may be maintained at a reasonable operational level. For example, the first electronic component 320 may be a signal mixer for qubit drive signals of various transmission lines while the second component 330 may be such an attenuator.

In various embodiments, any of the features discussed with reference to different embodiments of FIG. 16 may be combined with any other features to provide a modified cooling apparatus 300 that uses one or more triaxial cables, and corresponding triaxial connectors, therein. Some such combinations are described above (e.g. replacing one of the triaxial cables 342, 344 with a non-triaxial cable, while also replacing the corresponding connectors used to couple to these triaxial cables). In another example of a modification, a modified cooling apparatus 300 may include the triaxial cables 340 and 342, but no triaxial cables between other components (the second electronic component 330 may then be present or be absent altogether). In yet another example of a modification, a modified cooling apparatus 300 may include the triaxial cables 342 and 346, no triaxial cables between other components. In addition, in further embodiments, each of which may be combined with the embodiments of various triaxial cables described above, connectors of each of the components may be combined so that less connectors than shown in FIG. 16 may be used. In other embodiments, more connectors may be included with each of the components shown in FIG. 16. These particular combinations are simply examples, and, in further embodiments, any combination of features described herein, in particular of features described with referenced to the different triaxial cables used within the cooling apparatus 300, may be used.

Driving the Inner Shield Conductor of a Triaxial Cable as a Guard

In some embodiments, for any of the triaxial cables used in the cooling apparatus 300, during operation or during testing of the quantum circuit component 310, the first shield conductor 404 may be driven as a guard, i.e. it may be separately driven from the signal conductor 402 but with substantially the same signal characteristics (e.g. voltage, frequency, phase) as those of the signal applied to the signal conductor 402. The voltage drop between the signal conductor 402 and first shield conductor 404 may then be kept at or near zero, which advantageously results in near zero current leakage between the signal conductor 402 and the first shield conductor 404. Additionally, operating the first shield conductor 404 as a guard may shield the signal conductor 402 from external signals. To reduce cross talk between adjacent triaxial cables, a second shield conductor, i.e. the second shield conductor 406, may be utilized. In such embodiments, the second shield conductor 406 may be kept connected to an independent or common ground potential to prevent such cross talk.

Triaxial Attenuator for Use with a Quantum Circuit Component in a Cooling Apparatus As described above, the first and second electronic component 320, 330 may include any suitable type of electronic components used in a cooling apparatus for qubits, e.g., an attenuator, a filter, or an amplifier. In order to be able to support signals propagated via triaxial cables, such components would include one or more triaxial connectors.

Figure 18A:
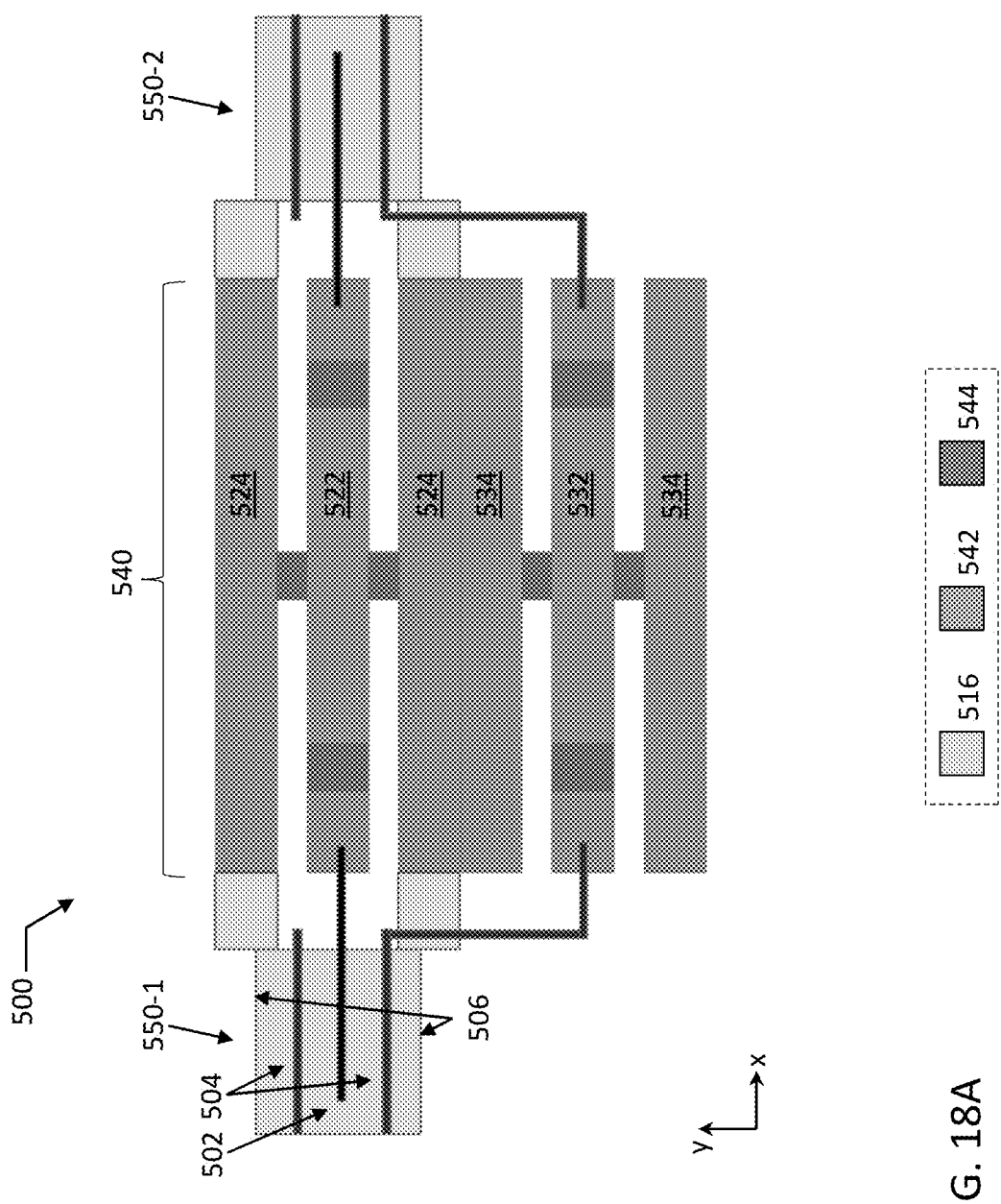
FIGS. 18A-18C provide schematic illustrations a triaxial attenuator, according to various embodiments of the present disclosure.
Figure 18B:
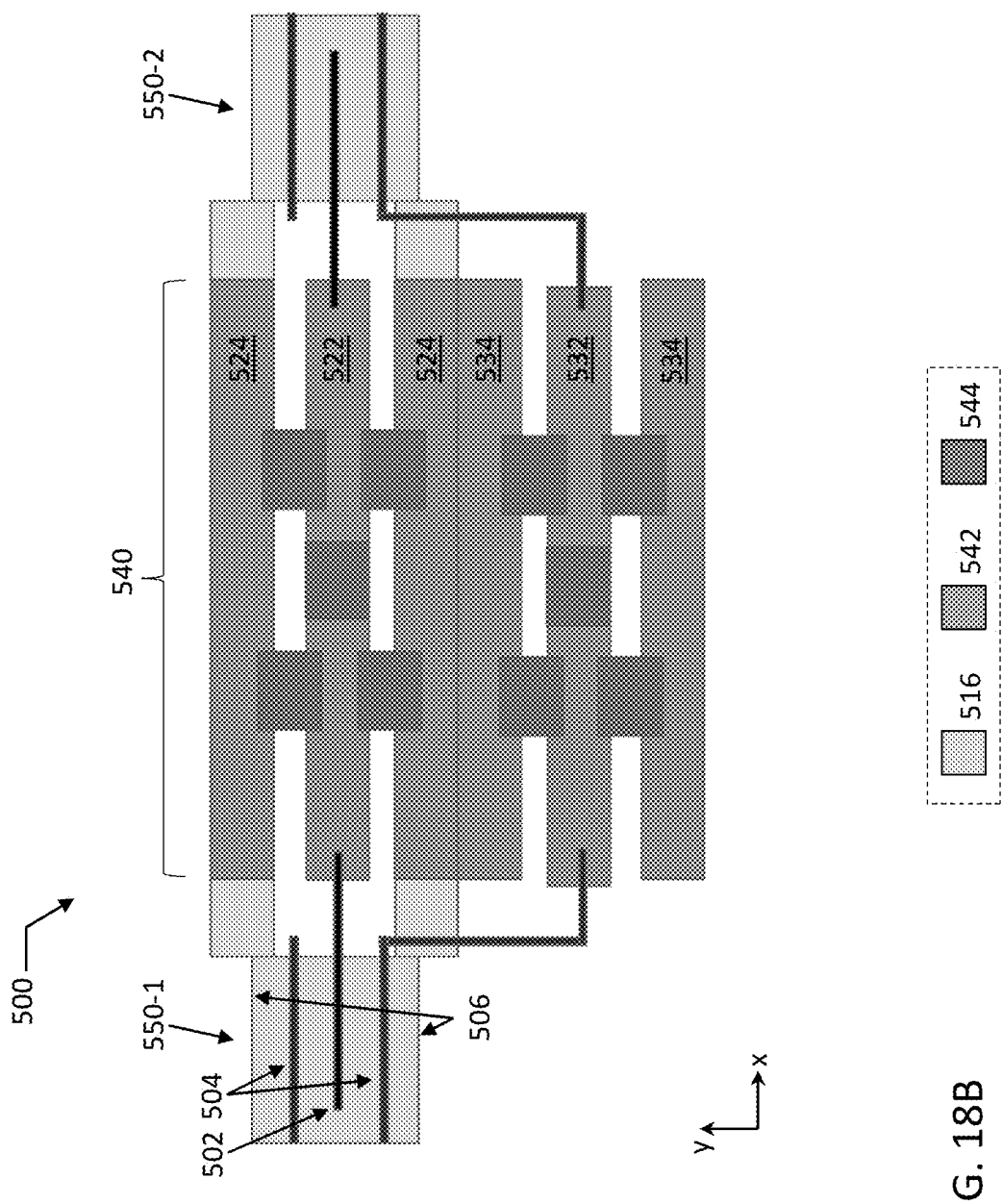
Figure 18C:
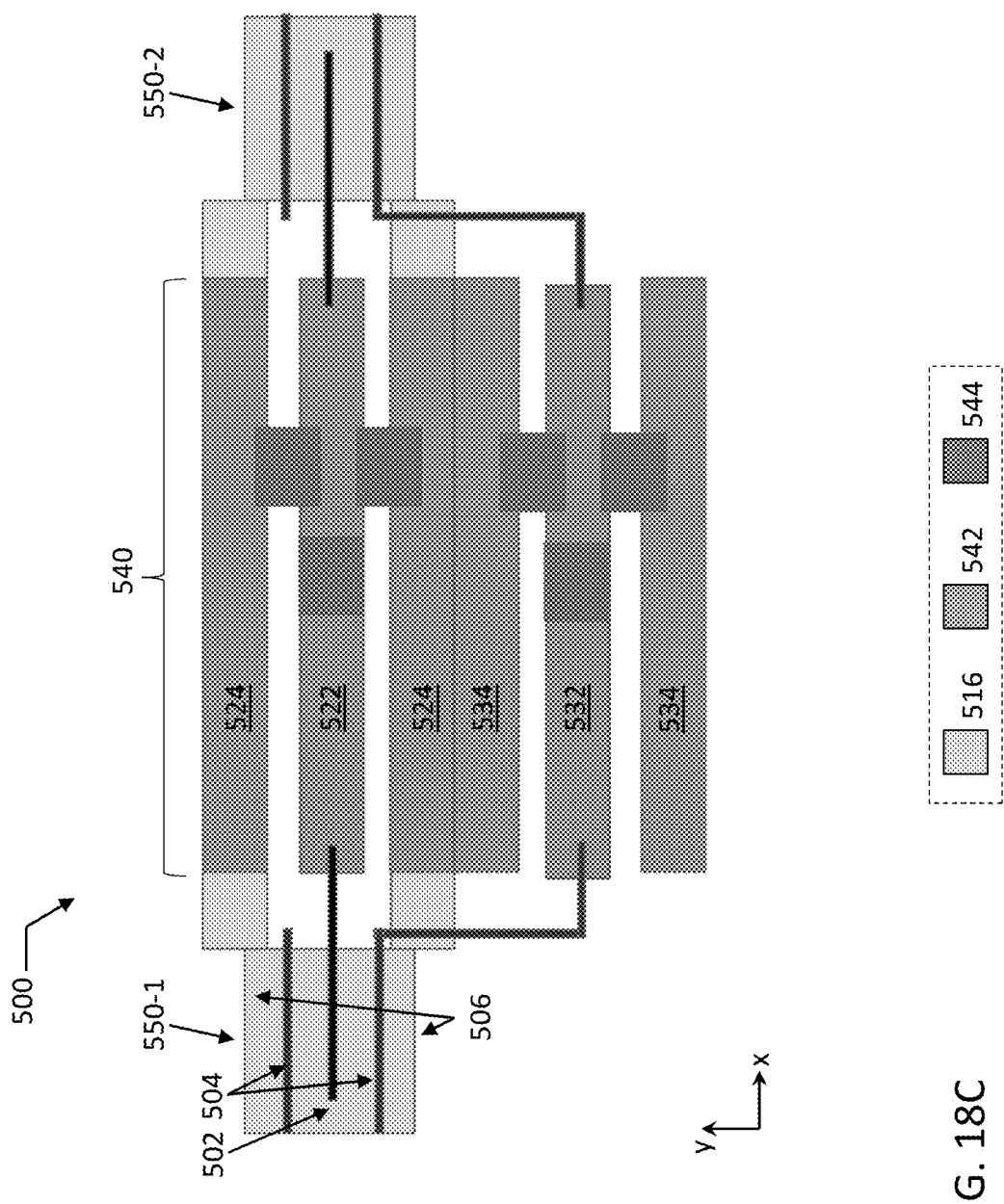

FIGS. 18A-18C provide schematic illustrations a triaxial attenuator 500, according to various embodiments of the present disclosure. Each of FIGS. 18A-18C illustrates a top-down view onto the qubit plane, i.e. the x-y plane, namely a section along an x-y plane that contains a signal connector 502 of each of triaxial connectors 550. Namely, each of FIGS. 18A-18C illustrates triaxial connectors 550, providing triaxial I/O ports on each side of a coplanar waveguide (CPW) section 540 that includes resistive material portions (triaxial connectors shown as a triaxial connector 550-1 on one side and a triaxial connector 550-2 on the other side of the attenuator 500), where each triaxial connector 550 includes a signal connector 502, a first shield connector 504, and a second shield connector 506. In some embodiments, the triaxial attenuator 500 according to each of FIGS. 18A-18C may be configured to use a common ground plane 516 (shown in FIGS. 18A-18C with light grey color, as indicated at the bottom of these FIGS.) for at least some microwave transmission lines included in the quantum circuit component 310 (e.g. for different resonators and non-resonant transmission lines that may be used in superconducting qubits as described above). The signal connector 502 of each triaxial connector 550 is configured for receiving a signal conductor of a triaxial cable, e.g. the signal conductor 402, the first shield connector 504 of each triaxial connector 550 is configured for receiving a first shield conductor of a triaxial cable, e.g. the first shield conductor 404, while the second shield connector 506 of each triaxial connector 550 is configured for receiving a second shield conductor of a triaxial cable, e.g. the second shield conductor 406. The recess of the signal connector 502 with respect to e.g. the first shield connector 504 shown in FIGS. 18A-18C illustrates that the triaxial connectors 550 are female connectors. In other embodiments, such connectors could be configured as male connectors. It should be noted that all other triaxial connectors described herein, e.g. the triaxial connectors of a quantum circuit component 310, or any of the triaxial connectors described with reference to FIG. 16, may be implemented as the triaxial connectors 550, and vice versa (thus, all of the descriptions provided with respect to triaxial connectors shown in FIG. 16 are applicable to the triaxial connectors 550, and vice versa).

Turning to the section 540 of the triaxial attenuators 500 shown in FIGS. 18A-18C, each section 540 includes two CPW portions, the first CPW portion having a signal conductor 522 surrounded by two ground conductors 524, and the second CPW portion having a signal conductor 532 surrounded by two ground conductors 534. This, the signal conductor 522 is between the two ground conductors 524 and is separated from each of the ground conductors 524 by a gap, while the signal conductor 532 is between the two ground conductors 534 and is separated from each of the ground conductors 534 by a gap. As shown in FIGS. 18A-18C, the signal connector 502 of each of the triaxial connectors 550 is connected to the signal conductor 522 of the first CPW portion of the CPW section 540. In conventional attenuators with coaxial connectors, this would be implemented in an analogous manner. What is drastically different from the coaxial attenuators is that, in the triaxial attenuator 500 according to any of FIGS. 18A-18C a second CPW portion is present, with the first shield connector 504 being connected to the signal conductor 532 of the second CPW portion. As previously described herein, in operation, the first shield conductor is driven as a guard, thus, the second CPW portion is driven as a guard and may be referred to as a "guard CPW" (while the second CPW portion may be referred to as a "signal CPW"). FIGS. 18A-18C also illustrate that, in some embodiments, the ground conductors 524 and 534 of the first and second CPW portions may be adjacent to one another and may be shared, as shown in FIGS. 18A-18C with the adjacent ground conductors 524 and 534 being shown as a single block of a CPW metal 542 (shown in FIGS. 18A-18C with grey color that is darker than the color of the ground 516 but lighter than the color of the resistive portions 544). FIGS. 18A-18C also illustrate various resistive portions 544 in each of the first and second CPW portions of the CPW section 540 shown, where these FIGS. differ in the configuration of the resistive portions 544. Namely, in various embodiments, the triaxial attenuator 500 may adapt T, L, or pi pad configurations, shown respectively in FIGS. 18A, 18B, and 18C, where each configuration represents a different scheme for impedance matching the attenuated load defined by locations of the resistive portions 544. As shown in FIGS. 18A-18C, the locations of the resistive portions 544 in the second CPW portion of the CPW section 540 can be matching those of the resistive portions 544 in the first CPW portion of the CPW section 540. As is known in the art, resistive portions of T, L-, or pi pad coaxial attenuators are portions of a resistive metal having a higher resistance than that of the CPW metal 542, which provides impedance matching.

FIGS. 18A-18C illustrate embodiments where all portions of the attenuator 500, in particular the signal CPW portion and the guard CPW portion, are provided on a single die and/or printed circuit board (PCB) as coplanar waveguides with resistive metals lithographically defined to achieve T, L, or pi pad configurations. In other embodiments, guard and signal CPW portions of the attenuator 500 may be separated by extra shielding in between (i.e. the ground conductors 524 and 534 which are shown to be a single block in FIGS. 18A-18C may be separated by an insulator) or may be placed on either side of an attenuator enclosure where the signal and guard attenuator paths on the coplanar waveguide attenuator featured in FIGS. 18A-18C may be physically separated and do not require to be on the same die and/or PCB. To create a compact system, FIGS. 18A-18C display the physical connection of the ground plane for each coplanar waveguide handling both the signal conductor and first shield conductor (guard). Such an attenuator may be primarily used to reduce incoming power of DC signals or microwave signals delivered to electronics at various stages of the cooling apparatus 300 so the electron temperature of the quantum circuit component 310 under test or operation may be kept sufficiently low. Such an attenuator may also be used to thermalize the conductors of signal cables containing both center signal conductors and first shield conductors being operated as a guard as the wiring runs from room temperature to the mixing chamber plate of the cooling apparatus 300.

Example Devices and Systems

Quantum circuit components that may be used in a cooling apparatus employing one or more triaxial cables as described above may be implemented using any kind of qubit devices or included in any kind of quantum processing devices/structures. Some examples of such devices/structures are illustrated in FIGS. 19A-19B, 20, and 21.

FIGS. 19A-19B are top views of a wafer 1100 and dies 1102 that may be formed from the wafer 1100, according to some embodiments of the present disclosure. The dies 1102 may include any of the qubit devices disclosed herein, e.g. the qubit devices described with reference to FIGS. 1-15, any further embodiments of such qubit devices as described herein, or any combinations of such qubit devices. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component, e.g. the quantum circuit component 310 as described herein. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 21) or other logic that is configured to store information in the memory devices or execute instructions stored in the memory array.

Figure 20:
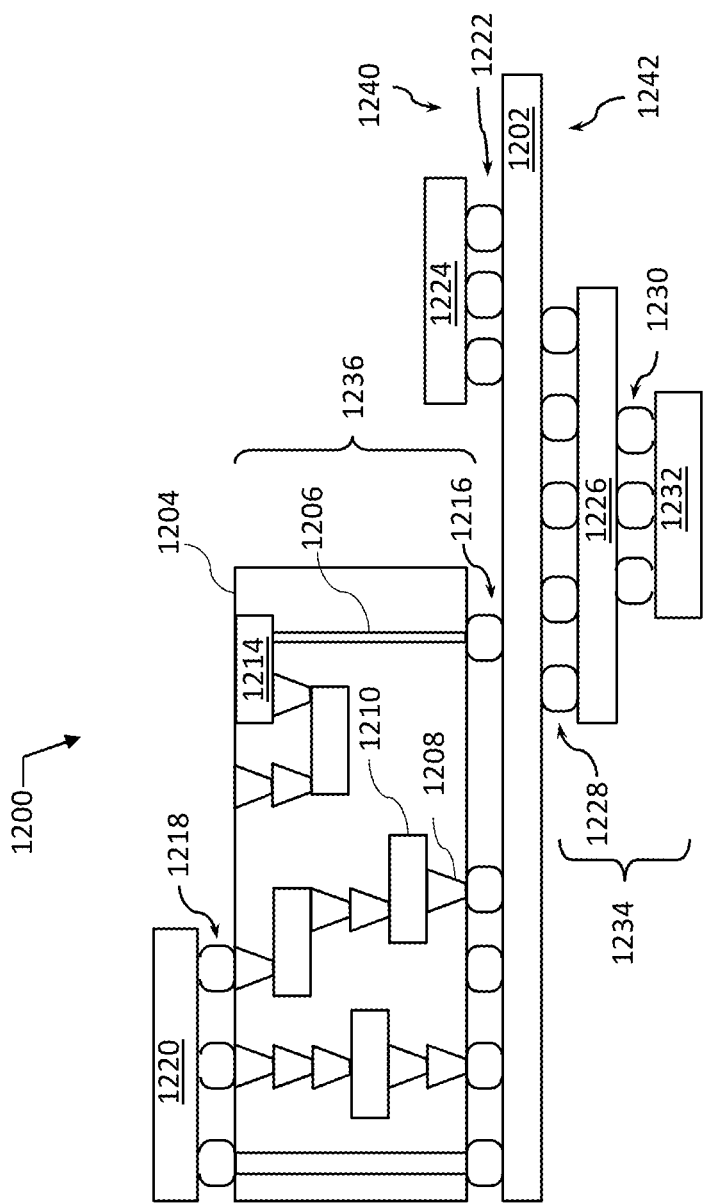
FIG. 20 is a cross-sectional side view of a device assembly that may include one or more of qubit devices disclosed herein.

FIG. 20 is a cross-sectional side view of a device assembly 1200 that may be included in any of the embodiments of the quantum circuit components disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 20 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 20), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 20, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g. a package including any of the qubit devices disclosed herein, e.g. the qubit devices described with reference to FIGS. 1-15, any further embodiments of such qubit devices as described herein, or any combinations of such qubit devices; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 20, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any qubit devices disclosed herein, e.g. the qubit devices described with reference to FIGS. 1-15, any further embodiments of such qubit devices as described herein, or any combinations of such qubit devices; or may be a conventional IC package, for example. In some embodiments, the package 1224 may take the form of any of the embodiments of the quantum circuit component 310 with one or more triaxial connectors as described herein.

The device assembly 1200 illustrated in FIG. 20 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 21:
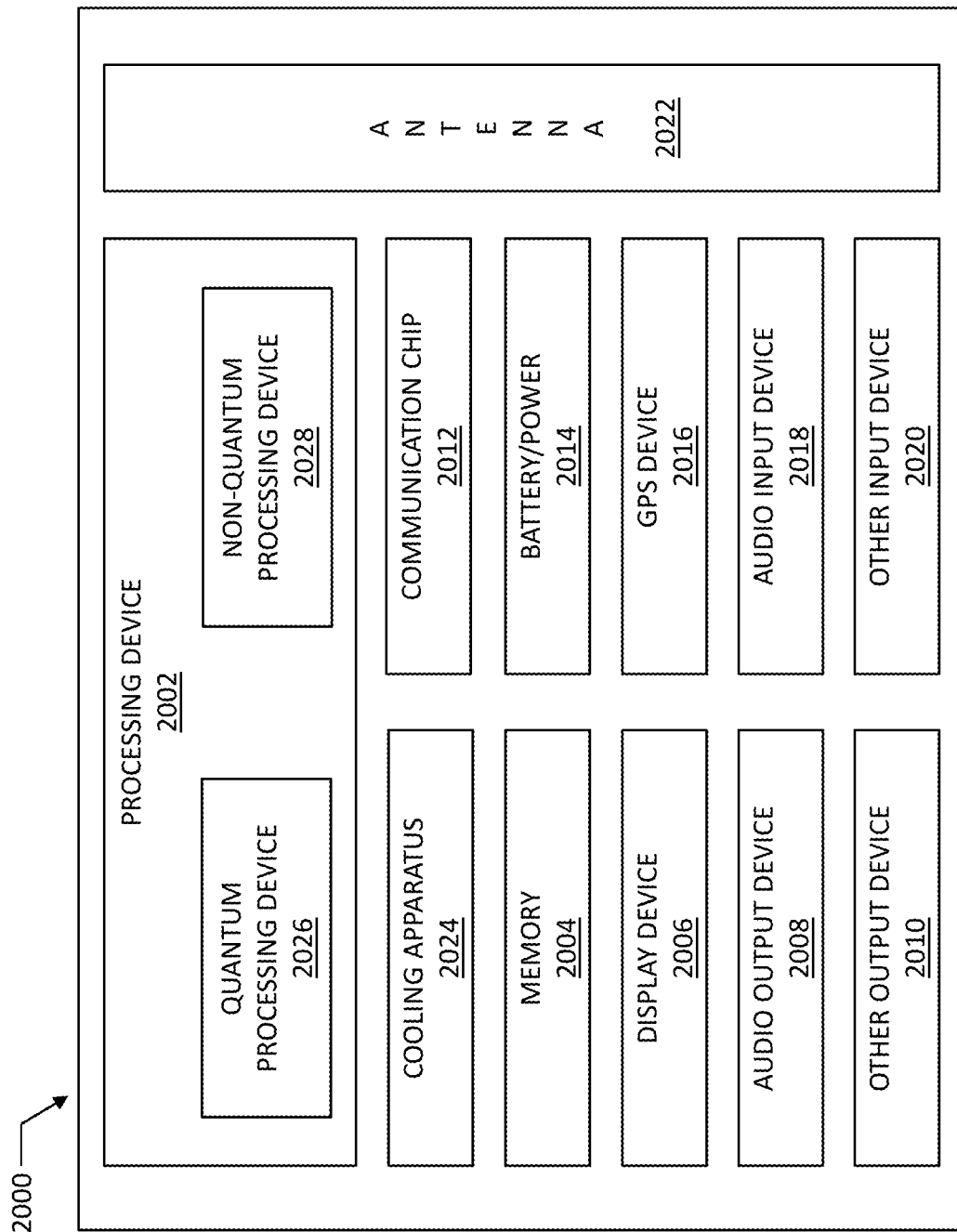
FIG. 21 is a block diagram of an example quantum computing device that may include one or more of qubit devices disclosed herein, in accordance with various embodiments.

FIG. 21 is a block diagram of an example quantum computing device 2000 that may include any of the qubit devices disclosed herein, e.g. the qubit devices described with reference to FIGS. 1-15, any further embodiments of such qubit devices as described herein, or any combinations of such qubit devices. A number of components are illustrated in FIG. 21 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 21, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030, and may instead operate at room temperature. In some embodiments, the cooling apparatus 2024 may be the cooling apparatus 300 in which one or more triaxial cables are provided, as described herein.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum circuit components disclosed herein, e.g. one or more of the quantum circuit components 310 with any of the qubit devices disclosed herein, e.g. the qubit devices described with reference to FIGS. 1-15, any further embodiments of such qubit devices as described herein, or any combinations of such qubit devices, and may perform data processing by performing operations on the qubits that may be generated in the quantum circuit components 310, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum circuit component, including a qubit die having at least one qubit device; and a triaxial connector for coupling the at least one qubit device to an electronic component using a triaxial cable.

Example 2 provides the quantum circuit component according to example 1, where the triaxial connector includes a signal connector for receiving a signal conductor of the triaxial cable, a first shield connector for receiving a first shield conductor of the triaxial cable, the first shield connector surrounding the signal connector, and a second shield connector for receiving a second shield conductor of the triaxial cable, the second shield connector surrounding the first shield connector.

Example 3 provides the quantum circuit component according to example 2, where the first shield connector is coaxial with the signal connector.

Example 4 provides the quantum circuit component according to examples 2 or 3, where the second shield connector is coaxial with the signal connector.

Example 5 provides the quantum circuit component according to any one of examples 2-4, where the signal connector and the first shield connector are separated by a first dielectric medium.

Example 6 provides the quantum circuit component according to any one of examples 2-5, where the first shield connector and the second shield connector are separated by a second dielectric medium.

Example 7 provides the quantum circuit component according to any one of examples 1-6, where the at least one qubit device includes at least one quantum dot qubit device that includes at least one plunger gate, and the triaxial connector is configured to support provision, from the electronic component, of at least one plunger voltage to be applied to the at least one plunger gate to control formation of one or more quantum dots in the at least one qubit device.

Example 8 provides the quantum circuit component according to any one of examples 1-6, where the at least one qubit device includes at least one quantum dot qubit device that includes two or more plunger gates and a barrier gate, and the triaxial connector is configured to support provision, from the electronic component, of at least one barrier voltage to be applied to the barrier gate to control a potential barrier between two adjacent plunger gates of the two or more plunger gates.

Example 9 provides the quantum circuit component according to any one of examples 1-6, where the at least one qubit device includes at least one quantum dot qubit device that includes at least one plunger gate, at least one barrier gate, and at least one accumulation gate, and the triaxial connector is configured to support provision, from the electronic component, of at least one barrier voltage to be applied to the at least one barrier gate to control a potential barrier between the at least one plunger gate and an adjacent one of the at least one accumulation gate.

Example 10 provides the quantum circuit component according to any one of examples 1-6, where the at least one qubit device includes at least one quantum dot qubit device that includes at least one accumulation gate, and the triaxial connector is configured to support provision, from the electronic component, of at least one accumulation voltage to be applied to the at least one accumulation gate to control a number of charge carriers in an area between an area where one or more quantum dots are to be formed and a charge carrier reservoir.

Example 11 provides the quantum circuit component according to any one of examples 1-6, where the at least one qubit device includes at least one superconducting qubit device that includes at least one flux bias line, and the triaxial connector is configured to support provision of a current from the electronic component to the at least one flux bias line.

Example 12 provides the quantum circuit component according to any one of examples 1-6, where the at least one qubit device includes at least one superconducting qubit device that includes at least one microwave drive line, and the triaxial connector is configured to support provision of a current from the electronic component to the at least one microwave drive line.

Example 13 provides the quantum circuit component according to any one of examples 1-6, where the triaxial connector is configured to support provision of a DC from the electronic component to the at least one qubit device.

Example 14 provides a cooling apparatus for a quantum circuit component, the cooling apparatus including a chamber for receiving the quantum circuit component that includes at least one qubit device, the chamber configured to maintain a temperature of the quantum circuit component below a threshold temperature (e.g. 5 degrees Kelvin) during operation of the quantum circuit component; and a triaxial connector for providing signals to and/or receiving signals from the quantum circuit component placed in the chamber using one or more triaxial cables.

Example 15 provides the cooling apparatus according to example 14, where the triaxial connector is included at an input/output (I/O) port of the cooling apparatus, the I/O port configured for coupling the quantum circuit component placed in the chamber to external circuitry outside of the cooling apparatus.

Example 16 provides the cooling apparatus according to example 15, where the cooling apparatus further includes an electronic component configured to be coupled to the triaxial connector using at least one of the one or more triaxial cables.

Example 17 provides the cooling apparatus according to example 16, where the at least one of the one or more triaxial cables is a first triaxial cable, and where the electronic component is further configured to be coupled to the quantum circuit component using a second triaxial cable of the one or more triaxial cables.

Example 18 provides the cooling apparatus according to examples 16 or 17, where the electronic component is one or an attenuator, a filter, or an amplifier.

Example 19 provides the cooling apparatus according to any one of examples 14-18, further including the one or more triaxial cables.

Example 20 provides the cooling apparatus according to any one of examples 14-19, where the cooling apparatus is a dilution refrigerator.

In various further examples, the triaxial connector of the cooling apparatus according to any one of examples 14-20 may be implemented analogously to the triaxial connector as in any one of examples 2-13.

Example 21 provides a triaxial cable for coupling a quantum circuit component that includes at least one qubit device and placed inside a cooling apparatus to an electronic component, the triaxial cable including a signal conductor; a first insulator at least partially surrounding the signal conductor along at least a portion of the signal conductor; a first shield conductor at least partially surrounding the first insulator along at least the portion of the signal conductor; a second insulator at least partially surrounding the first shield conductor along at least the portion of the signal conductor; and a second shield conductor at least partially surrounding the second insulator along at least the portion of the signal conductor.

Example 22 provides the triaxial cable according to example 21, where one or more of the signal conductor, the first shield conductor, and the second shield conductor include one or more metals configured to reduce heat load at low temperatures.

Example 23 provides the triaxial cable according to example 22, where the one or more metals have a thermal conductivity below about between about $5 \cdot 10^{-4}$ watts per centimeter-kelvin.

Example 24 provides the triaxial cable according to any one of examples 21-23, where the first shield conductor is coaxial with at least the portion of the signal conductor, and the second shield conductor is coaxial with at least the portion of the signal conductor.

Example 25 provides the triaxial cable according to any one of examples 21-24, where the first insulator is different from the second insulator.

In various examples, the first and second insulators may include one or more of PFA, Teflon, PTFE, FEP, graphite coated FEP, and graphite coated PTFE.

Example 26 provides the triaxial cable according to any one of examples 21-25, where the first shield conductor is configured to be driven as a guard during operation of the quantum circuit component.

Example 27 provides the triaxial cable according to any one of examples 21-26, where the at least one qubit device includes at least one quantum dot qubit device that includes at least one plunger gate, and the triaxial cable is configured to provide, from the electronic component to the quantum circuit component, at least one plunger voltage to be applied to the at least one plunger gate to control formation of one or more quantum dots in the at least one qubit device.

Example 28 provides the triaxial cable according to any one of examples 21-26, where the at least one qubit device includes at least one quantum dot qubit device that includes two or more plunger gates and a barrier gate, and the triaxial cable is configured to provide, from the electronic component to the quantum circuit component, at least one barrier voltage to be applied to the barrier gate to control a potential barrier between two adjacent plunger gates of the two or more plunger gates.

Example 29 provides the triaxial cable according to any one of examples 21-26, where the at least one qubit device includes at least one quantum dot qubit device that includes at least one plunger gate, at least one barrier gate and at least one accumulation gate, and the triaxial cable is configured to provide, from the electronic component to the quantum circuit component, at least one barrier voltage to be applied to the at least one barrier gate to control a potential barrier between the at least one plunger gate and an adjacent one of the at least one accumulation gate.

Example 30 provides the triaxial cable according to any one of examples 21-26, where the at least one qubit device includes at least one quantum dot qubit device that includes at least one accumulation gate, and the triaxial cable is configured to provide, from the electronic component to the quantum circuit component, at least one accumulation voltage to be applied to the at least one accumulation gate to control a number of charge carriers in an area between an area where one or more quantum dots are to be formed and a charge carrier reservoir.

Example 31 provides the triaxial cable according to any one of examples 21-26, where the at least one qubit device includes at least one superconducting qubit device that includes at least one flux bias line, and the triaxial cable is configured to provide current from the electronic component to the at least one flux bias line.

Example 32 provides the triaxial cable according to any one of examples 21-26, where the at least one qubit device includes at least one superconducting qubit device that includes at least one microwave drive line, and the triaxial cable is configured to provide current from the electronic component to the at least one microwave drive line.

Example 33 provides the triaxial cable according to any one of examples 21-26, where the triaxial cable is configured to provide DC from the electronic component to the quantum circuit component.

Example 34 provides a conversion structure for converting a coaxial cable that includes a signal conductor and a first shield conductor coaxial with the shield conductor to a triaxial cable for coupling a quantum circuit component that includes at least one qubit device and placed inside a cooling apparatus to an electronic component. The conversion structure includes an insulator configured to be placed around the first shield conductor to at least partially surround the first shield conductor along at least a portion of the signal conductor, and a second shield conductor adaptable to be placed around the insulator to at least partially surround the second shield conductor along at least the portion of the signal conductor.

Example 35 provides the conversion structure according to example 34, where the second shield conductor includes one or more metals configured to reduce heat load at low temperatures.

Example 36 provides the conversion structure according to example 35, where the one or more metals have a thermal conductivity below about between about $5 \cdot 10^{-4}$ watts per centimeter-kelvin.

Example 37 provides the conversion structure according to any one of examples 34-36, where the insulator is configured to be snapped on the first shield conductor.

Example 38 provides the conversion structure according to any one of examples 34-37, where the insulator includes one or more of perfluoroalkoxy (PFA), Teflon, polytetrafluoroethylene (PTFE), fluorinated ethylene propylene (FEP), graphite coated FEP, and graphite coated PTFE.

Example 39 provides an electronic component for use inside a cooling apparatus and for being coupled to a quantum circuit component that includes at least one qubit device inside the cooling apparatus. The electronic component includes a triaxial connector for coupling the electronic component to the at least one qubit device using a triaxial cable.

Example 40 provides the electronic component according to example 39, where the triaxial connector includes a signal connector for receiving a signal conductor of the triaxial cable, a first shield connector for receiving a first shield conductor of the triaxial cable, the first shield connector surrounding the signal connector, and a second shield connector for receiving a second shield conductor of the triaxial cable, the second shield connector surrounding the first shield connector.

Example 41 provides the electronic component according to example 40, where the first shield connector is coaxial with the signal connector.

Example 42 provides the electronic component according to examples 40 or 41, where the second shield connector is coaxial with the signal connector.

Example 43 provides the electronic component according to any one of examples 40-42, where the signal connector and the first shield connector are separated by a first dielectric medium.

Example 44 provides the electronic component according to any one of examples 40-43, where the first shield connector and the second shield connector are separated by a second dielectric medium.

Example 45 provides the electronic component according to any one of examples 39-44, where the at least one qubit device includes at least one quantum dot qubit device that includes at least one plunger gate, and the triaxial connector is configured to support provision, from the electronic component, of at least one plunger voltage to be applied to the at least one plunger gate to control formation of one or more quantum dots in the at least one qubit device.

Example 46 provides the electronic component according to any one of examples 39-44, where the at least one qubit device includes at least one quantum dot qubit device that includes two or more plunger gates and a barrier gate, and the triaxial connector is configured to support provision, from the electronic component, of at least one barrier voltage to be applied to the barrier gate to control a potential barrier between two adjacent plunger gates of the two or more plunger gates.

Example 47 provides the electronic component according to any one of examples 39-44, where the at least one qubit device includes at least one quantum dot qubit device that includes at least one plunger gate, at least one barrier gate and at least one accumulation gate, and the triaxial connector is configured to support provision, from the electronic component, of at least one barrier voltage to be applied to the at least one barrier gate to control a potential barrier between the at least one plunger gate and an adjacent one of the at least one accumulation gate.

Example 48 provides the electronic component according to any one of examples 39-44, where the at least one qubit device includes at least one quantum dot qubit device that includes at least one accumulation gate, and the triaxial connector is configured to support provision, from the electronic component, of at least one accumulation voltage to be applied to the at least one accumulation gate to control a number of charge carriers in an area between an area where one or more quantum dots are to be formed and a charge carrier reservoir.

Example 49 provides the electronic component according to any one of examples 39-44, where the at least one qubit device includes at least one superconducting qubit device that includes at least one flux bias line, and the triaxial connector is configured to support provision of a current from the electronic component to the at least one flux bias line.

Example 50 provides the electronic component according to any one of examples 39-44, where the at least one qubit device includes at least one superconducting qubit device that includes at least one microwave drive line, and the triaxial connector is configured to support provision of a current from the electronic component to the at least one microwave drive line.

Example 51 provides the electronic component according to any one of examples 39-44, where the triaxial connector is configured to support provision of DC from the electronic component to the at least one qubit device.

Example 52 provides the electronic component according to any one of examples 39-51, where the electronic component is an attenuator.

Example 53 provides the electronic component according to example 52, where the triaxial connector is a first triaxial connector, the attenuator further includes a second triaxial connector, a first waveguide portion, and a second waveguide portion, the first triaxial connector is coupled to a signal conductor of the first waveguide portion, and the second triaxial connector is coupled to a signal conductor of the second waveguide portion.

Example 54 provides the electronic component according to example 53, where each of the first waveguide portion and the second waveguide portion includes a plurality of resistive portions configured to provide impedance matching in one of T, L, or pi pad configurations.

Example 55 provides the electronic component according to examples 53 or 54, where each of the first waveguide portion and the second waveguide portion is a coplanar waveguide.

Example 56 provides the electronic component according to any one of examples 53-55, where the second waveguide portion is configured to be driven as a guard during operation of the electronic component.

Example 57 provides the electronic component according to any one of examples 53-56, where the second triaxial connector includes a signal connector for receiving a signal conductor of a second triaxial cable, a first shield connector for receiving a first shield conductor of the second triaxial cable, the first shield connector surrounding the signal connector, and a second shield connector for receiving a second shield conductor of the second triaxial cable, the second shield connector surrounding the first shield connector.

Example 58 provides a method of operating an assembly that includes a quantum circuit component including at least one qubit device, an electronic component, and a coaxial cable configured to couple the quantum circuit component and the electronic component, the method including providing an insulator to at least partially surround the coaxial cable; and providing an additional shield conductor to at least partially surround the insulator.

Example 59 provides the method according to example 58, where the insulator includes one or more of PFA, Teflon, PTFE, FEP, graphite coated FEP, and graphite coated PTFE. In other embodiments, instead of providing a solid insulator, the additional shield conductor may be separated from the coaxial cable by a gap, e.g. an air gap, a gap filled with any other gas or a collection of gasses, or a substantially vacuum gap.

Example 60 provides the method according to examples 58 or 59, where the coaxial cable includes a signal conductor and a shield conductor at least partially surrounding and coaxial with the signal conductor, and where the method further includes, during operation of the quantum circuit component driving the shield conductor as a guard, and connecting the additional shield conductor to ground potential.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum circuit assembly, comprising:
a quantum circuit component, comprising a first triaxial connector and a qubit die having a qubit device; and
an attenuator, comprising a second triaxial connector,
wherein the attenuator is to be coupled to the qubit device using a triaxial cable between the first triaxial connector and the second triaxial connector.

2. The quantum circuit assembly according to claim 1, wherein the first triaxial connector includes:
a signal connector for receiving a signal conductor of the triaxial cable,
a first shield connector for receiving a first shield conductor of the triaxial cable, the first shield connector surrounding the signal connector, and
a second shield connector for receiving a second shield conductor of the triaxial cable, the second shield connector surrounding the first shield connector.

3. The quantum circuit assembly according to claim 2, wherein the first shield connector is coaxial with the signal connector.

4. The quantum circuit assembly according to claim 2, wherein the second shield connector is coaxial with the signal connector.

5. An electronic component for use inside a cooling apparatus and for being coupled to a quantum circuit component that includes a qubit device inside the cooling apparatus, the electronic component comprising:
a triaxial connector for coupling the electronic component to the qubit device using a triaxial cable,
wherein the electronic component is an attenuator.

6. The electronic component according to claim 5, wherein the triaxial connector includes:
a signal connector for receiving a signal conductor of the triaxial cable,
a first shield connector for receiving a first shield conductor of the triaxial cable, the first shield connector surrounding the signal connector, and
a second shield connector for receiving a second shield conductor of the triaxial cable, the second shield connector surrounding the first shield connector.

7. The electronic component according to claim 5, wherein:
the triaxial connector is a first triaxial connector,
the attenuator further comprises a second triaxial connector, a first waveguide portion, and a second waveguide portion,
the first triaxial connector is coupled to a signal conductor of the first waveguide portion, and
the second triaxial connector is coupled to a signal conductor of the second waveguide portion.

8. The electronic component according to claim 7, wherein each of the first waveguide portion and the second waveguide portion is a coplanar waveguide.

9. The electronic component according to claim 7, wherein the second triaxial connector includes:
a signal connector for receiving a signal conductor of a second triaxial cable,
a first shield connector for receiving a first shield conductor of the second triaxial cable, the first shield connector surrounding the signal connector, and
a second shield connector for receiving a second shield conductor of the second triaxial cable, the second shield connector surrounding the first shield connector.

10. The quantum circuit assembly according to claim 1, wherein:
the qubit device is a quantum dot qubit device that includes at least one plunger gate, and
the qubit device is configured to receive, over the triaxial cable, a plunger voltage to be applied to the at least one plunger gate.

11. The quantum circuit assembly according to claim 1, wherein:
the qubit device is a quantum dot qubit device that includes a plurality of plunger gates and a barrier gate, and
the qubit device is configured to receive, over the triaxial cable, a barrier voltage to be applied to the barrier gate to control a potential barrier between two adjacent plunger gates of the plurality of plunger gates.

12. The quantum circuit assembly according to claim 1, wherein:
the qubit device is a quantum dot qubit device that includes at least one accumulation gate, and
the qubit device is configured to receive, over the triaxial cable, an accumulation voltage to be applied to the at least one accumulation gate.

13. The electronic component according to claim 5, wherein:
the qubit device is a quantum dot qubit device that includes at least one plunger gate, and
the electronic component is configured to provide to the qubit device, over the triaxial cable, a plunger voltage to be applied to the at least one plunger gate.

14. The electronic component according to claim 5, wherein:
the qubit device is a quantum dot qubit device that includes a plurality of plunger gates and a barrier gate, and
the electronic component is configured to provide to the qubit device, over the triaxial cable, a barrier voltage to be applied to the barrier gate to control a potential barrier between two adjacent plunger gates of the plurality of plunger gates.

15. The electronic component according to claim 5, wherein:
the qubit device is a quantum dot qubit device that includes at least one accumulation gate, and
the electronic component is configured to provide to the qubit device, over the triaxial cable, an accumulation voltage to be applied to the at least one accumulation gate.

16. The electronic component according to claim 5, wherein:
the qubit device is a superconducting qubit device that includes at least one flux bias line and at least one microwave drive line, and
the electronic component is configured to provide to the qubit device, over the triaxial cable, a current to the at least one flux bias line or at least one microwave drive line.

17. An electronic component for use inside a cooling apparatus and for being coupled to a quantum circuit component that includes a qubit device inside the cooling apparatus, the electronic component comprising:

a triaxial connector for coupling the electronic component to the qubit device using a triaxial cable, wherein the electronic component is an amplifier or a filter.

18. The electronic component according to claim 17, wherein the triaxial connector includes:
    a signal connector for receiving a signal conductor of the triaxial cable,
    a first shield connector for receiving a first shield conductor of the triaxial cable, the first shield connector surrounding the signal connector, and
    a second shield connector for receiving a second shield conductor of the triaxial cable, the second shield connector surrounding the first shield connector.

19. The electronic component according to claim 17, wherein:
    the qubit device is a quantum dot qubit device that includes at least one plunger gate, and
    the electronic component is configured to provide to the qubit device, over the triaxial cable, a plunger voltage to be applied to the at least one plunger gate.

20. A method of operating a quantum circuit assembly, the method comprising:
    providing a signal over a signal conductor of a triaxial cable coupling an electronic component and a quantum circuit component, wherein the electronic component includes an attenuator, an amplifier, or a filter, and wherein the quantum circuit component includes a qubit device; and
    driving a shield conductor of the triaxial cable as a guard, while having an additional shield conductor of the triaxial cable connected to ground potential,
    wherein the shield conductor at least partially surrounds the signal conductor and the additional shield conductor at least partially surrounds the shield conductor.

21. The method according to claim 20, wherein:
    the qubit device is a quantum dot qubit device that includes at least one plunger gate, and
    providing the signal over the signal conductor of the triaxial cable includes providing, from the electronic component, of a plunger voltage to be applied to the at least one plunger gate to control formation of one or more quantum dots in the qubit device.

22. The method according to claim 20, wherein:
    the qubit device is a quantum dot qubit device that includes a plurality of plunger gates and a barrier gate, and
    providing the signal over the signal conductor of the triaxial cable includes providing, from the electronic component, of at least one barrier voltage to be applied to the barrier gate to control a potential barrier between two adjacent plunger gates of the plurality of plunger gates.

23. The method according to claim 20, wherein:
    the qubit device is a quantum dot qubit device that includes at least one plunger gate, at least one barrier gate, and at least one accumulation gate, and
    providing the signal over the signal conductor of the triaxial cable includes providing, from the electronic component, of at least one barrier voltage to be applied to the at least one barrier gate to control a potential barrier between the at least one plunger gate and the at least one accumulation gate.

24. The method according to claim 20, wherein:
    the qubit device is a quantum dot qubit device that includes at least one accumulation gate, and
    providing the signal over the signal conductor of the triaxial cable includes providing, from the electronic component, of at least one accumulation voltage to be applied to the at least one accumulation gate to control a number of charge carriers in an area between an area where one or more quantum dots are to be formed and a charge carrier reservoir.

25. The method according to claim 20, wherein:
    the qubit device is a superconducting qubit device that includes at least one flux bias line or at least one microwave drive line, and
    providing the signal over the signal conductor of the triaxial cable includes providing, from the electronic component, of a current to the at least one flux bias line or the at least one microwave drive line.

* * * * *